(12) United States Patent
Ito et al.

(10) Patent No.: US 6,278,395 B1
(45) Date of Patent: Aug. 21, 2001

(54) FOLDING AND INTERPOLATION ANALOG-TO-DIGITAL CONVERTER

(75) Inventors: Masao Ito; Takeshi Shigenobu, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/435,207

(22) Filed: Nov. 5, 1999

(30) Foreign Application Priority Data

Jun. 23, 1999 (JP) .................................................. 11-176856

(51) Int. Cl.[7] .............................. H03M 1/50; H03M 1/12
(52) U.S. Cl. ............................................. 341/166; 341/159
(58) Field of Search ..................................... 341/159, 155, 341/154, 166

(56) References Cited

U.S. PATENT DOCUMENTS 5,629,700  5/1997  Kumamoto et al. .
5,731,776 * 3/1998  Kumamoto et al. ................. 341/159
6,175,323 * 1/2001  Flynn .................................. 341/156

OTHER PUBLICATIONS

Rob E. J. Van De Grift, et al. "An 8–bit Video ADC Incorporating Folding and Interpolation Techniques", IEEE Journal of Solid–State Circuits, vol. sc–22. No. 6. Dec. 1987. pp. 944–953.

* cited by examiner

Primary Examiner—Peguy JeanPierre
(74) Attorney, Agent, or Firm—Oblon, Spivak, McClelland, Maier & Neustadt, P.C.

(57) ABSTRACT

An object is to obtain an A/D converter with improved A/D conversion accuracy. The resistor elements (R) and (R) are connected through wiring (L10) (2×L11, L12, 2×L13) mostly with two resistor elements left therebetween. For example, the resistor elements ($R_1$) and ($R_2$) are connected through the partial wiring (L11) and (L13) extended to the left in the diagram, and the resistor elements ($R_3$) and ($R_4$) are connected through the partial wiring (L11) and (L13) extended to the right in the diagram. Thus all of the wiring (L10) connecting electrically adjacent resistor elements (R) and (R) are formed of a combination of partial wiring {2×L11, L12, 2×L13}.

8 Claims, 20 Drawing Sheets

FOLDING AND INTERPOLATION ANALOG-TO-DIGITAL CONVERTER

BACKGROUND OF THE INVENTION

1. Field of the Invention

The present invention relates to an analog-to-digital converter (A/D converter) for converting an analog signal to a digital signal, and particularly to a circuit configuration of an interpolation circuit which is one of its component circuits.

2. Description of the Background Art

The role of interpolation circuits in A/D converters will now be described. The A/D converters include the folding interpolation architecture A/D converter shown in FIG. 15.

As shown in FIG. 15, a reference voltage group 111 includes N ($\geq 2$) reference voltages $Vref_1$, to $Vref_N$, in which the reference voltages $Vref_1$ to $Vref_N$ are outputted to the folding circuit 72 in the block B1 and J (<N) of the reference voltages $Vref_1$ to $Vref_N$ are outputted to the comparator group 84 as reference voltages $Vrr_1$ to $Vrr_j$ for the block B2. FIG. 16 shows an A/D converter having a resolution of six bits, which is constructed on the basis of the configuration shown in FIG. 15.

In this architecture, A/D conversion is performed separately in the two circuit blocks B1 and B2. The circuit block B2 is used to achieve rough A/D conversion to determine higher-order bits in the digital code and the circuit block B1 is used to achieve detailed A/D conversion to determine lower-order bits in the digital code. The higher-order bits and lower-order bits can be combined in many combinations in that architecture, according to which the numbers of comparators, J and M, in the circuit blocks B2 and B1 vary as shown in Table 1. The circuit shown in FIG. 16 corresponds to the configuration in which J=3, M=16, and N=20 in Table 1.

TABLE 1

| | | N | | |
|---|---|---|---|---|
| J | M | twofold interpolation | fourfold interpolation | eightfold interpolation |
| 0 | 64 | 32 | 16 | 8 |
| 1 | 32 | 48 | 24 | 12 |
| 3 | 16 | 40 | 20 | 10 |
| 7 | 8 | 36 | 18 | 9 |
| 15 | 4 | 34 | – | – |

FIG. 17 is a circuit diagram showing an example of the internal configuration of the interpolation circuit 73. The number of reference voltages, N, supplied to the folding circuit 72 changes as shown in Table 1 depending on the configuration of the interpolation circuit 73. The interpolation circuit of FIG. 17 corresponds to the fourfold interpolation in Table 1, which generates output signals $V_{i0}$, $V_{i1}$, $V_{i2}$, $V_{i3}$ (i=1, 2, 3 . . . ) from ends of the four resistors R30 provided in series between the applied input voltage $V_i$ and the input voltage $V_{(i+1)}$ (i=1, 2, 3 . . . ). That is to say, the interpolation circuit 73 has the fourfold interpolation function.

Next, operation of the above-described A/D converter will be described mainly about the example of structure shown in FIG. 16.

The comparators $CMP_i$ (i=1, 2, 3) in the block B2 compare an analog input voltage Vin and the respective reference voltages $Vrr_i$ (i=1, 2, 3) in magnitude, and they output "H" when the analog input signal Vin is larger than the reference voltage $Vvv_i$, and "L" when the analog input signal Vin is smaller than the reference voltage $Vrr_i$.

The preencoder 85 pre-encodes the outputs (comparison results) of the comparator group 84 to generate encoder control signals $SP_j$ (j=1, 2, 3, 4).

The encoder 86 determines the higher-order 2-bit digital codes D5 and D4 in accordance with the encoder control signals SP. Table 2 below shows the comparator outputs from the comparator group 84, the preencoder outputs from the preencoder 85, and the encoder outputs from the encoder 86, for various magnitude relations among the analog input signal Vin and the reference voltages $Vrr_1$ to $Vrr_3$.

TABLE 2

| Input voltage conditions | comparator outputs | | | preencoder outputs | | | | encoder outputs | |
|---|---|---|---|---|---|---|---|---|---|
| | $CMP_3$ | $CMP_2$ | $CMP_1$ | $SP_4$ | $SP_3$ | $SP_2$ | $SP_1$ | D5 | D4 |
| Vin < $Vrr_1$ | L | L | L | L | L | L | H | L | L |
| $Vrr_1 \leq$ Vin < $Vrr_2$ | L | L | H | L | L | H | L | L | H |
| $Vrr_2 \leq$ Vin < $Vrr_3$ | L | H | H | L | H | L | L | H | L |
| $Vrr_3 \leq$ Vin | H | H | H | H | L | L | L | H | H |

The folding circuit 72 in the block B1 performs analog computation on the basis of the analog input signal Vin and the reference voltages $Vref_k$ (k=1, 2 . . . 20) and transmits four sets of output signal pairs $VF_m$ and $VFB_m$ (m=1, 2, 3, 4) (not shown in FIG. 16) to the interpolation circuit 73 in the next stage. The output signal $VFB_m$ is a complementary signal of $VF_m$.

The above-stated analog computation performed by the folding circuit 72 has the output characteristics as shown in FIG. 18, which generates the output signal pairs $VF_n$ and $VFB_n$ (n=1, 2, 3, 4) from the analog input signal Vin and the reference voltages $Vref_n$, $Vref_{n+3}$, $Vref_{n+6}$, $Vref_{n+9}$, $Vref_{n+12}$ (n=1, 2, 3, 4). The output signal pair $VF_n$ and $VFB_n$ are complementary signals as a pair of differential signals.

The interpolation circuit 73 voltage-divides the output signals on the basis of the four signal pairs of the output signals $VF_n$ and $VFB_n$ (n=1, 2, 3, 4) from the folding circuit 72 to generate and transfer 16 signal pairs $VI_y$ and $VIB_y$ (y=1, 2 . . . 16) (not shown in FIG. 16) to the comparator group 74 in the next stage. Table 3 shows the relation between the signal pairs $VF_n$ and $VFB_n$ and $VI_y$ and $VIB_y$.

TABLE 3

| k | $VI_k$ | $VIB_k$ |
|---|---|---|
| 1 | $VF_1$ | $VFB_1$ |
| 2 | $VF_1 \times 3/4 + VF_2 \times 1/4$ | $VFB_1 \times 3/4 + VFB_2 \times 1/4$ |
| 3 | $VF_1 \times 1/2 + VF_2 \times 1/2$ | $VFB_1 \times 1/2 + VFB_2 \times 1/2$ |
| 4 | $VF_1 \times 1/4 + VF_2 \times 3/4$ | $VFB_1 \times 1/4 + VFB_2 \times 3/4$ |
| 5 | $VF_2$ | $VFB_2$ |
| 6 | $VF_2 \times 3/4 + VF_3 \times 1/4$ | $VFB_2 \times 3/4 + VFB_3 \times 1/4$ |
| 7 | $VF_2 \times 1/2 + VF_3 \times 1/2$ | $VFB_2 \times 1/2 + VFB_3 \times 1/2$ |
| 8 | $VF_2 \times 1/4 + VF_3 \times 3/4$ | $VFB_2 \times 1/4 + VFB_3 \times 3/4$ |
| 9 | $VF_3$ | $VFB_3$ |
| 10 | $VF_3 \times 3/4 + VF_4 \times 1/4$ | $VFB_3 \times 3/4 + VFB_4 \times 1/4$ |
| 11 | $VF_3 \times 1/2 + VF_4 \times 1/2$ | $VFB_3 \times 1/2 + VFB_4 \times 1/2$ |
| 12 | $VF_3 \times 1/4 + VF_4 \times 3/4$ | $VFB_3 \times 1/4 + VFB_4 \times 3/4$ |
| 13 | $VF_4$ | $VFB_4$ |
| 14 | $VF_4 \times 3/4 + VFB_1 \times 1/4$ | $VFB_4 \times 3/4 + VF_1 \times 1/4$ |
| 15 | $VF_4 \times 1/2 + VFB_1 \times 1/2$ | $VFB_4 \times 1/2 + VF_1 \times 1/2$ |
| 16 | $VF_4 \times 1/4 + VFB_1 \times 3/4$ | $VFB_4 \times 1/4 + VF_1 \times 3/4$ |

As shown in Table 3, for example, while $VI_1$ is equal to $VF_1$, $VI_2$ is the voltage which is most close to $VF_1$ among the four fractions of the voltage range of $VF_1$ and $VF_2$ ($VI_2 = VF_1 \times 3/4 + VF_2 \times 1/4$), and $VI_3$ is the middle voltage among the four fractions of the voltage range of $VF_1$ and $VF_2$ ($VI_3 = VF_1 \times 1/2 + VF_2 \times 1/2$).

The comparators $CMPD_y$ (y=1, 2 ... 16) in the comparator group 74 compare the signal pairs $VI_y$ and $VIB_y$ in magnitude. They output "H" when the signal $VI_y$ is larger than the signal $VIB_y$ and "L" in the opposite case.

The preencoder 75 generates encoder control signals $SPD_y$ (y=1, 2 ... 16) on the basis of the outputs of the comparator group 74 (not shown in FIG. 16).

The encoder 76 determines and outputs the lower-order four-bit digital codes D3, D2, D1, D0 according to the encoder control signals SPD.

Tables 4 to 6 show the comparator outputs from the comparator group 74 the preencoder outputs from the preencoder 75, and the encoder outputs from the encoder 76, for part of the conditions of the magnitude relation among the analog input signal Vin and the reference voltages $Vref_k$.

TABLE 4

C1 = $Vref_2 \leq Vin < Vref_2 \times 3/4 + Vref_3 \times 1/4$

C2 = $Vref_2 \times 3/4 + Vref_3 \times 1/4 \leq Vin < Vref_2 \times 1/2 + Vref_3 \times 1/2$ C3 = $Vref_2 \times 1/2 + Vref_3 \times 1/2 \leq Vin < Vref_2 \times 1/4 + Vref_3 \times 3/4$ C4 = $Vref_2 \times 1/4 + Vref_3 \times 3/4 \leq Vin < Vref_3$ C5 = $Vref_3 \leq Vin < Vref_3 \times 3/4 + Vref_4 \times 1/4$ C6 = $Vref_3 \times 3/4 + Vref_4 \times 1/4 \leq Vin < Vref_3 \times 1/2 + Vref_4 \times 1/2$ C7 = $Vref_3 \times 1/2 + Vref_4 \times 1/2 \leq Vin < Vref_3 \times 1/4 + Vref_4 \times 3/4$ C8 = $Vref_3 \times 1/4 + Vref_4 \times 3/4 \leq Vin < Vref_4$ C9 = $Vref_4 \leq Vin < Vref_4 \times 3/4 + Vref_5 \times 1/4$ C10 = $Vref_4 \times 3/4 + Vref_5 \times 1/4 \leq Vin < Vref_4 \times 1/2 + Vref_5 \times 1/2$ C11 = $Vref_4 \times 1/2 + Vref_5 \times 1/2 \leq Vin < Vref_4 \times 1/4 + Vref_5 \times 3/4$ C12 = $Vref_4 \times 1/4 + Vref_5 \times 3/4 \leq Vin < Vref_5$ C13 = $Vref_5 \leq Vin < Vref_5 \times 3/4 + Vref_6 \times 1/4$ C14 = $Vref_5 \times 3/4 + Vref_6 \times 1/4 \leq Vin < Vref_5 \times 1/2 + Vref_6 \times 1/2$ C15 = $Vref_5 \times 1/2 + Vref_6 \times 1/2 \leq Vin < Vref_5 \times 1/4 + Vref_6 \times 3/4$ C16 = $Vref_5 \times 1/4 + Vref_6 \times 3/4 \leq Vin < Vref_6$

TABLE 5

| | comparator $CMPD_i$ outputs | | | | | | | | | | | | | | | |
|---|---|---|---|---|---|---|---|---|---|---|---|---|---|---|---|---|
| Input condition | i = 16 | i = 15 | i = 14 | i = 13 | i = 12 | i = 11 | i = 10 | i = 9 | i = 8 | i = 7 | i = 6 | i = 5 | i = 4 | i = 3 | i = 2 | i = 1 |
| ... | | | | | | | | | | | | | | | | |
| C1 | L | L | L | L | L | L | L | L | L | L | L | L | L | L | L | H |
| C2 | L | L | L | L | L | L | L | L | L | L | L | L | L | L | H | H |
| C3 | L | L | L | L | L | L | L | L | L | L | L | L | L | H | H | H |
| C4 | L | L | L | L | L | L | L | L | L | L | L | L | H | H | H | H |
| C5 | L | L | L | L | L | L | L | L | L | L | L | H | H | H | H | H |
| C6 | L | L | L | L | L | L | L | L | L | L | H | H | H | H | H | H |
| C7 | L | L | L | L | L | L | L | L | L | H | H | H | H | H | H | H |
| C8 | L | L | L | L | L | L | L | L | H | H | H | H | H | H | H | H |
| C9 | L | L | L | L | L | L | L | H | H | H | H | H | H | H | H | H |
| C10 | L | L | L | L | L | L | H | H | H | H | H | H | H | H | H | H |
| C11 | L | L | L | L | L | H | H | H | H | H | H | H | H | H | H | H |
| C12 | L | L | L | L | H | H | H | H | H | H | H | H | H | H | H | H |
| C13 | L | L | L | H | H | H | H | H | H | H | H | H | H | H | H | H |
| C14 | L | L | H | H | H | H | H | H | H | H | H | H | H | H | H | H |
| C15 | L | H | H | H | H | H | H | H | H | H | H | H | H | H | H | H |
| C16 | H | H | H | H | H | H | H | H | H | H | H | H | H | H | H | H |
| ... | | | | | | | | | | | | | | | | |

TABLE 6

| INPUT CONDITION | PREENCODER OUTPUT SPi | | | | | | | | | | | | | | | | ENCODER OUTPUT | | | |
|---|---|---|---|---|---|---|---|---|---|---|---|---|---|---|---|---|---|---|---|---|
| | i=16 | i=15 | i=14 | i=13 | i=12 | i=11 | i=10 | i=9 | i=8 | i=7 | i=6 | i=5 | i=4 | i=3 | i=2 | i=1 | D3 | D2 | D1 | D0 |
| C1 | L | L | L | L | L | L | L | L | L | L | L | L | L | L | L | H | L | L | L | L |
| C2 | L | L | L | L | L | L | L | L | L | L | L | L | L | L | H | L | L | L | L | H |
| C3 | L | L | L | L | L | L | L | L | L | L | L | L | L | H | L | L | L | L | H | L |
| C4 | L | L | L | L | L | L | L | L | L | L | L | L | H | L | L | L | L | L | H | H |
| C5 | L | L | L | L | L | L | L | L | L | L | L | H | L | L | L | L | L | H | L | L |
| C6 | L | L | L | L | L | L | L | L | L | L | H | L | L | L | L | L | L | H | L | H |
| C7 | L | L | L | L | L | L | L | L | L | H | L | L | L | L | L | L | L | H | H | L |
| C8 | L | L | L | L | L | L | L | L | H | L | L | L | L | L | L | L | L | H | H | H |
| C9 | L | L | L | L | L | L | L | H | L | L | L | L | L | L | L | L | H | L | L | L |
| C10 | L | L | L | L | L | L | H | L | L | L | L | L | L | L | L | L | H | L | L | H |
| C11 | L | L | L | L | L | H | L | L | L | L | L | L | L | L | L | L | H | L | H | L |
| C12 | L | L | L | L | H | L | L | L | L | L | L | L | L | L | L | L | H | L | H | H |
| C13 | L | L | L | H | L | L | L | L | L | L | L | L | L | L | L | L | H | H | L | L |
| C14 | L | L | H | L | L | L | L | L | L | L | L | L | L | L | L | L | H | H | L | H |
| C15 | L | H | L | L | L | L | L | L | L | L | L | L | L | L | L | L | H | H | H | L |
| C16 | H | L | L | L | L | L | L | L | L | L | L | L | L | L | L | L | H | H | H | H |

Next, the circuit configuration of the interpolation circuit 73, particularly its layout, will be described. FIG. 19 is an explanation diagram showing the layout of the interpolation circuit 73. In FIG. 19, the circuit blocks $C_n$ (n=1, 2, 3, 4) are sub-circuits in the folding circuit 72, each outputting a signal pair $VF_n$ and $VFB_n$. The 32 resistor elements RR1 to RR32 are resistor elements for interpolation, and L50 and L51 are wiring for connecting the adjacent resistor elements RRi and RR(i+1) (i=1 to 15), and RR32 and RR1.

Now problems of the conventional layout of the interpolation circuit 73 shown in FIG. 19 will be described. For convenience, one of the resistor elements RR1 to RR32 is referred to as a resistor element RR.

The output voltages $VI_x$ and $VIB_x$ (x=1, 5, 9, 13) of the interpolation circuit 73 correspond to $VF_{([x/4]+1)}$ ([x/4] is the quotient of x divided by 4) and $VFB_{([x/4]+1)}$.

The output voltages $VI_y$ and $VIB_y$ (y=2, 3, 4, 6, 7, 8, 10, 11, 12) of the interpolation circuit 73 are obtained by dividing the voltage range between $VF_{([(x-1)/4]+1)}$ and $VF_{[(x-1)/4+2]}$, or between $VFB_{[(x-1)/4+1]}$ and $VFB_{[(x-1)/4+2]}$ by the sum of four resistor elements RR (resistance value R) and resistance components rr of four wiring L50 (resistance value r), i.e. 4×(R+r).

The output voltages $VI_z$ and $VIB_z$ (z=14, 15, 16) of the interpolation circuit 73 are obtained by dividing the voltage range between $VF_4$ and $VFB_1$ or between $VFB_4$ and $VF_1$ by the sum of four resistor elements RR, three wiring 50, and resistance component rr' of one wiring L51 (resistance value r'), i.e. 4R+3r+r'.

The resistance value r and the resistance value r' take different values since the wiring L50 and the wiring L51 differ in length, and therefore the division is not uniform between the output voltages $VI_y$ and $VIB_y$ (y=2, 3, 4, 6, 7, 8, 10, 11, 12) and $VI_z$ and $VIB_z$ (z=14, 15, 16) of the interpolation circuit 73, which deteriorates accuracy of the output voltages.

The time required for the outputs of the interpolation circuit 73 to vary on the basis of the output signals $VF_n$ and $VFB_n$ from the circuit blocks $C_n$ (n=1, 2, 3, 4) is proportional to the product of the resistance value and capacitance value of the resistor elements and wiring connected to the respective input terminals of the interpolation circuit 73.

For $VI_y$ and $VIB_y$ (y=2, 3, 4, 6, 7, 8, 10, 11, 12) generated on the basis of at least one of the output signals of the circuit blocks $C_2$ and $C_3$, it is proportional to the product of the resistance value 4×(R+r) and the total quantity C of the parasitic capacitance. On the other hand, for the output signals $VI_z$ and $VIB_z$ (z=14, 15, 16) of the interpolation circuit which are generated on the basis of the output signals of the circuit blocks $C_1$ and $C_4$, the time required for change is proportional to the product of the resistance value 4R+3r+r' and the total quantity C' of parasitic capacitance of the wiring. The resistance values r and r' take different values since the wiring L50 and L51 differ in length. Further, the total quantities of the parasitic capacitance, C and C', also take different values since the wiring L50 and L51 differing in length have different parasitic capacitance values.

Accordingly the time required for change of the first output signal group $VI_y$ and $VIB_y$ (y=2, 3, 4, 6, 7, 8, 10, 11, 12) of the interpolation circuit 73 differs from the time required for change of the second output signal group $VI_z$ and $VIB_z$ (z=14, 15, 16). The comparators $CMPD_k$ (k=1, 2 . . . 16) in the comparator group 74 following the interpolation circuit 73 all perform the magnitude comparing operation by the same timing. Therefore, when the output signals from the interpolation circuit 73 vary at different points of time, the time difference ΔT causes errors in the outputs of the comparator group 74, which deteriorates the converting accuracy of the A/D converter.

The deterioration of conversion accuracy caused by the unequal timing will be described below. For example, assume that, in a certain comparison, the voltage difference between the pair of output signals $VF_1$ and $VFB_1$ from the circuit block $C_1$ is originally $+V_1+\Delta V$ at the last moment of the comparison period T and the voltage difference between the pair of output signals $VF_2$ and $VFB_2$ from the block $C_2$ is $-V_1$.

In this condition, when $0<\Delta V<2V_1$, for example, the magnitude relation of $VI_1>VIB_1$, $VI_2>VIB_2$, $VI_3>VIB_3$, $VI_4<VIB_4$, $VI_5<VIB_5$ holds in the outputs of the interpolation circuit 73. Then, in normal operation, the outputs from the comparators $CMPD_1$ to $CMPD_3$ are at "H" and the outputs of the $CMPD_4$ and $CMPD_5$ are at "L."

However, the time difference ΔT exists between the times required for the output signals to change from the voltages in the previous comparison period T. Then, suppose that, at the last moment of the comparison period T, the voltage difference between the pair of output signals $VF_1$ and $VFB_1$ takes a value $+V_1+\Delta V'$ ($>2V_1$), instead of the normal value $+V_1+\Delta V$, and the voltage difference between $VF_2$ and $VFB_2$ takes the value $-V_1$.

In this case, in the outputs of the interpolation circuit 73, the magnitude relation of $VI_1>VIB_1$, $VI_2>VIB_2$, $VI_3>VIB_3$, $VI_4>VIB_4$, $VI_5<VIB_5$ holds, and then the outputs of the comparators $CMPD_1$ to $CMPD_4$ are at "H" and the output of the $CMPD_5$ is at "L." Thus an error occurs with respect to the normal value. This error deteriorates the conversion accuracy of the A/D converter.

Especially, as the comparison period T for the comparators is shorter in a higher speed A/D converter, the time difference $\Delta T$ in variation among the output signals of the interpolation circuit 73 occupies a larger part in the comparison period T, and the output error of the comparators becomes still larger.

As another example of the layout other than that shown in FIG. 19, the resistors RR13 to RR16 (and wiring L52 between them) between $VF_4$ and $VFB_1$ between the blocks $C_4$ and $C_1$ and the resistors RR29 to RR32 (and wiring L52 between them) between $VFB_4$ and $VF_1$ are arranged as shown in FIG. 20 so that the wiring L50 and L52 have reduced differences in resistance value and parasitic capacitance value. This layout is the same as that shown in FIG. 19 in other respects.

However, this layout cannot avoid the deterioration of the A/D conversion accuracy, since the lengths of the wiring L50 and the wiring L52 still differ considerably also in this case.

SUMMARY OF THE INVENTION

According to a first aspect of the present invention, an A/D converter which analog-to-digital converts an analog input voltage to output a digital output voltage comprises: a reference conversion voltage output portion for converting the analog input voltage on the basis of a plurality of reference voltages to output a plurality of reference conversion voltages; an intermediate voltage generating portion having a predetermined number of resistance units respectively provided between one voltage and the other voltage in pairs of the predetermined number of the reference conversion voltages in the plurality of reference conversion voltages, for generating a plurality of intermediate voltages by resistance division using the predetermined number of resistance units and outputting a plurality of conversion voltages including the plurality of intermediate voltages; and a digital data output portion for outputting the digital output voltage on the basis of the plurality of conversion voltages. Each of the predetermined number of resistance units in the intermediate voltage generating portion comprises a first input terminal connected to the one voltage, a second input terminal connected to the other voltage, a plurality of resistor elements having the same resistance value, the plurality of intermediate voltages including at least part of voltages obtained from one end of each of the plurality of resistor elements, and a resistor connecting wiring provided so as to connect the plurality of resistor elements in series between the first and second input terminals, and wherein in all of the predetermined number of resistance units, the resistor connecting wiring is arranged so that the range between the one voltage and the other voltage is uniformly divided by the plurality of resistor elements in consideration of resistance component accompanying the resistor connecting wiring.

Preferably, according to a second aspect, in the A/D converter, the plurality of conversion voltages further comprise the plurality of reference conversion voltages, and the resistor connecting wiring are arranged so that capacitance components of the plurality of resistor elements and the resistor connecting wiring have equal capacitance value in all of the predetermined number of resistance units.

Preferably, according to a third aspect, in the A/D converter, the reference conversion voltage output portion has its entire configuration integrally formed in respect of layout.

Preferably, according to a fourth aspect, in the A/D converter, the plurality of reference conversion voltages include a first number of first reference conversion voltages and a second number of second reference conversion voltages, and the reference conversion voltage output portion comprises a first partial reference conversion voltage output portion for outputting the first number of first reference conversion voltages and a second partial reference conversion voltage output portion for outputting the second number of second reference conversion voltages, the first and second partial reference conversion voltage output portions being formed separately from each other in respect of layout, and wherein the intermediate voltage generating portion is provided between the first partial reference conversion voltage output portion and the second partial reference conversion voltage output portion in respect of layout.

As has been stated above, in the intermediate voltage generating portion in the A/D converter of the first aspect of the present invention, in all of the predetermined number of resistance units each provided between one voltage and the other voltage in the predetermined number of pairs of the reference conversion voltages, the resistor connecting wiring is arranged so that the range between the one voltage and the other voltage is uniformly divided by the plurality of resistor elements in consideration of resistance component accompanying the resistor connecting wiring.

Accordingly, the uniformity in the resistance division by the plurality of resistors is accurately secured so that the plurality of intermediate voltages including at least part of voltages obtained from one end of each of the plurality of resistor elements can be highly accurate, and then the A/D conversion accuracy can be improved.

According to the A/D converter of the second aspect, the resistor connecting wiring are arranged so that capacitance components of the plurality of resistor elements and the resistor connecting wiring have equal capacitance value in all of the predetermined number of resistance units.

As a result, no time difference is produced between voltage variations of the plurality of conversion voltages. Accordingly, when the digital data output portion outputs the digital output voltage on the basis of the plurality of conversion voltages, the processing is not adversely influenced and thus the A/D conversion accuracy is further improved.

According to the A/D converter of the third aspect, since the entire configuration of the reference conversion voltage output portion is integrally formed in respect of layout, the cost can be reduced by using an already-existing circuitry as the reference conversion voltage output portion.

According to the A/D converter of the fourth aspect, the intermediate voltage generating portion is provided between the first partial reference conversion voltage output portion and the second partial reference conversion voltage output portion in layout, so that the predetermined number of resistance units can be formed with reduced redundant regions in the intermediate voltage generating portion, thus allowing improvement of the degree of integration.

The present invention has been made to solve the above-described problems, and an object of the present invention is to obtain an A/D converter with improved A/D conversion accuracy.

These and other objects, features, aspects and advantages of the present invention will become more apparent from the following detailed description of the present invention when taken in conjunction with the accompanying drawings.

DESCRIPTION OF THE PREFERRED EMBODIMENTS

<First Preferred Embodiment>

Figure 1:
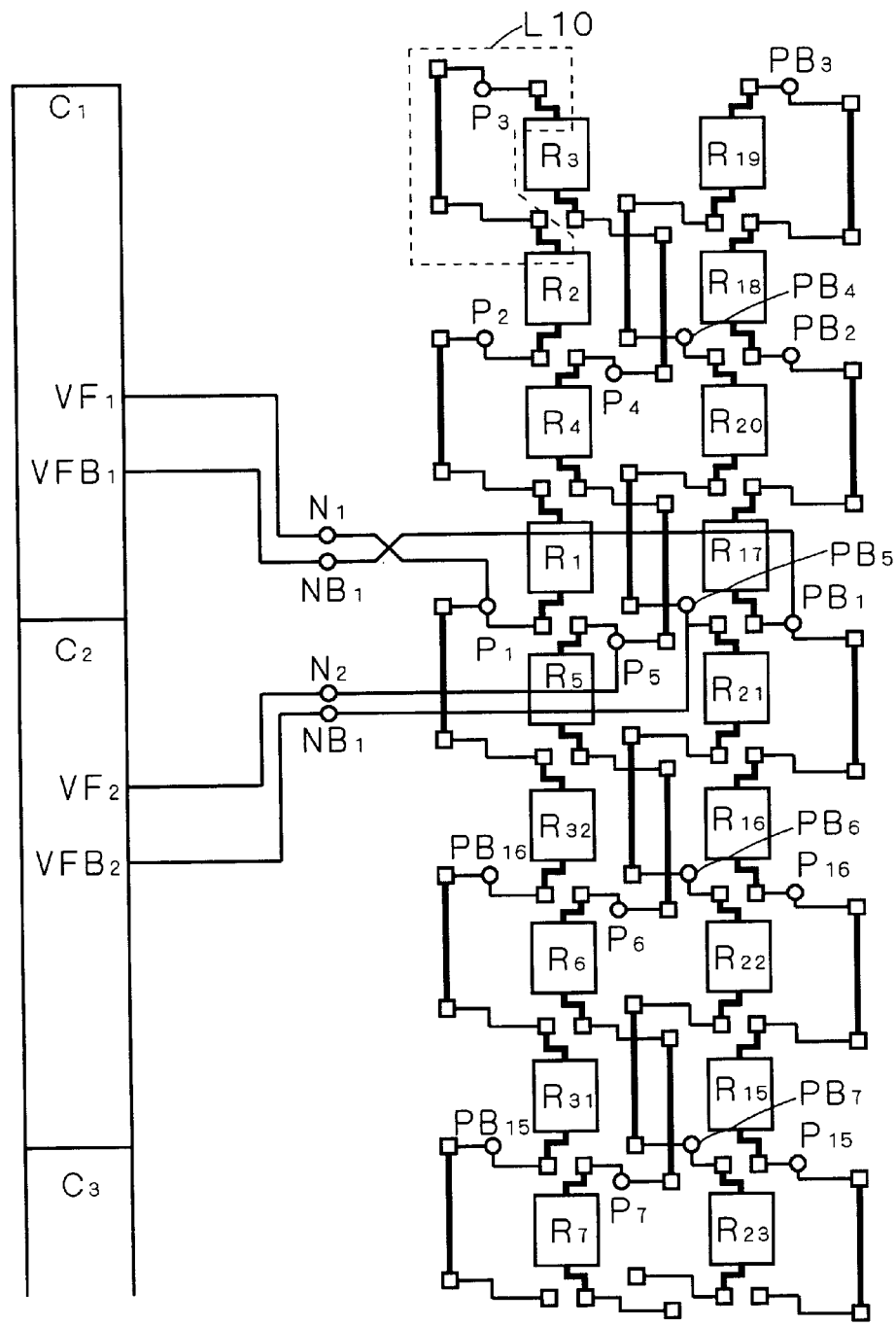
FIGS. 1 and 2 are explanation diagrams showing the layout configuration of an interpolation circuit in an A/D converter according to a first preferred embodiment of the present invention.
Figure 2:
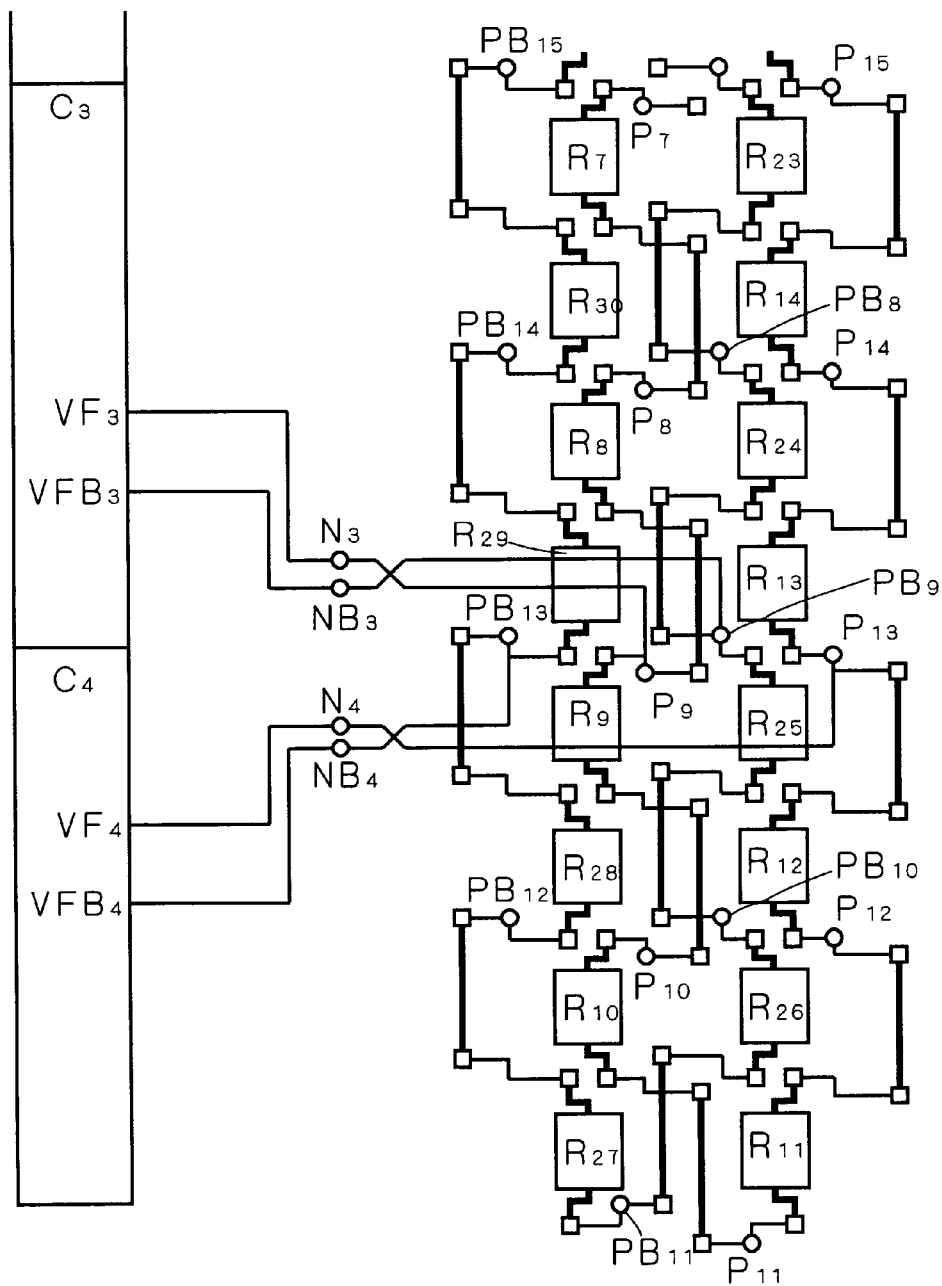

FIGS. 1 and 2 are explanation diagrams showing the layout of an interpolation circuit in an A/D converter according to a first preferred embodiment of the present invention.

Figure 15:
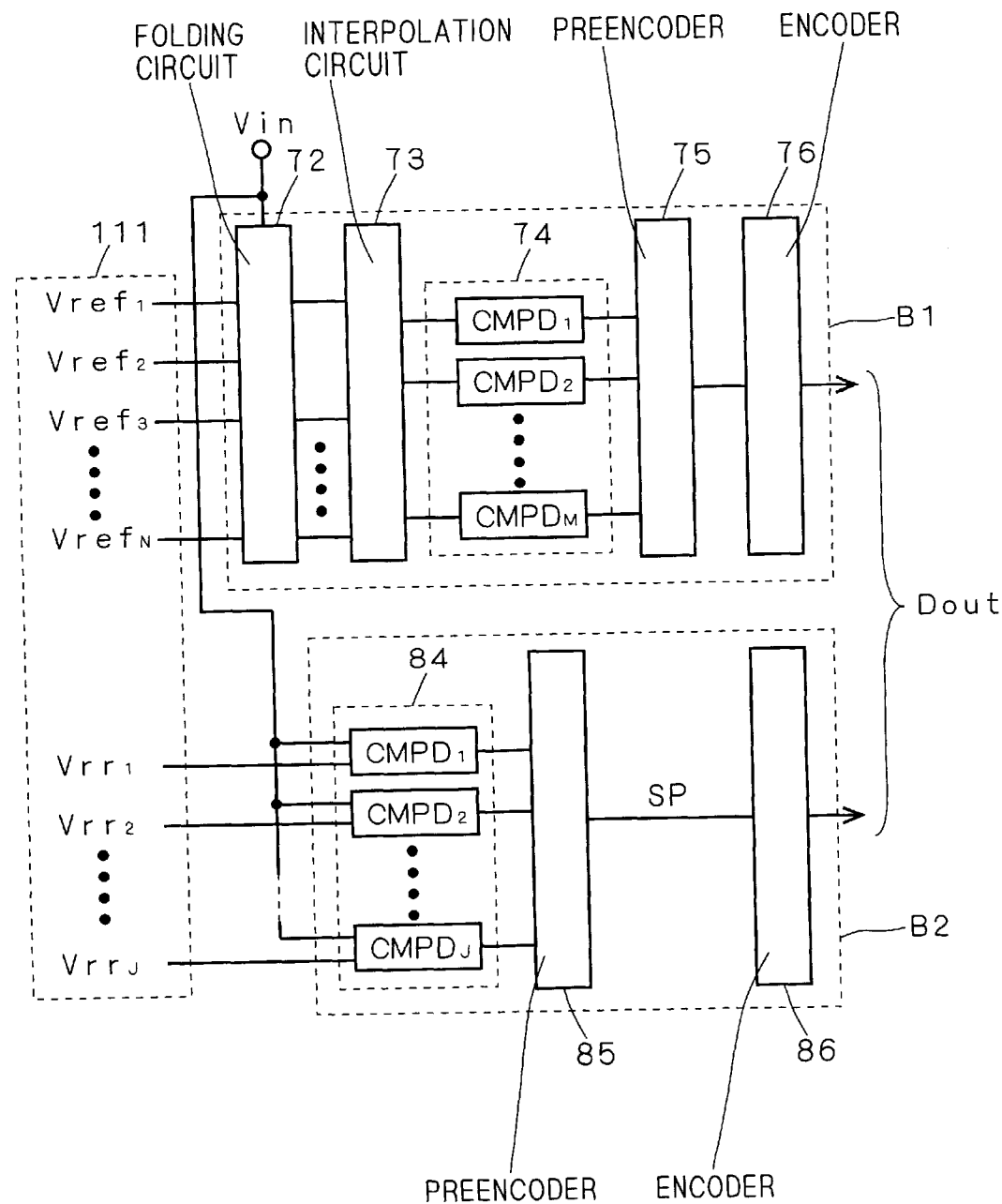
FIG. 15 is a block diagram showing a common configuration of an folding interpolation architecture A/D converter.
Figure 16:
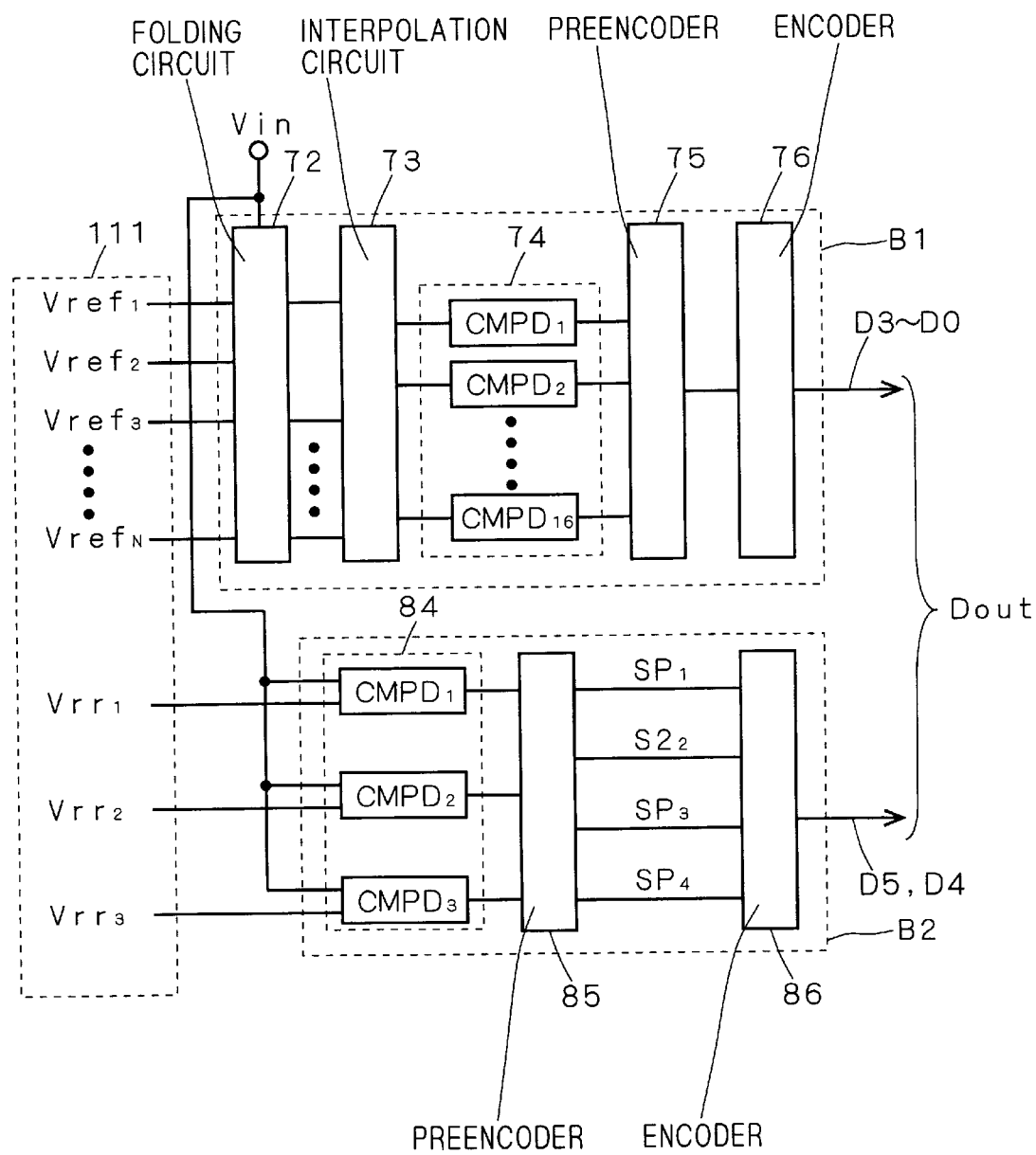
FIG. 16 is a block diagram showing the configuration of a 6-bit output folding interpolation architecture A/D converter.
Figure 17:
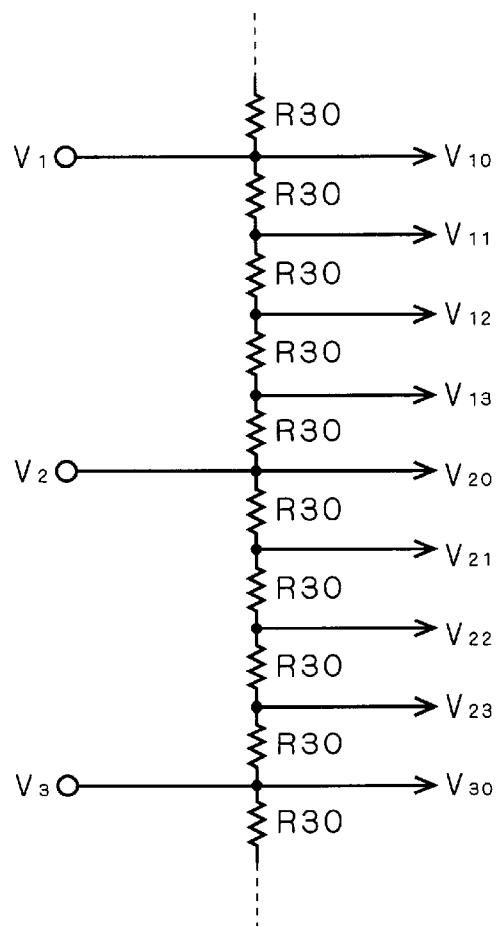
FIG. 17 is a circuit diagram showing an example of internal structure of the interpolation circuit.
Figure 18:
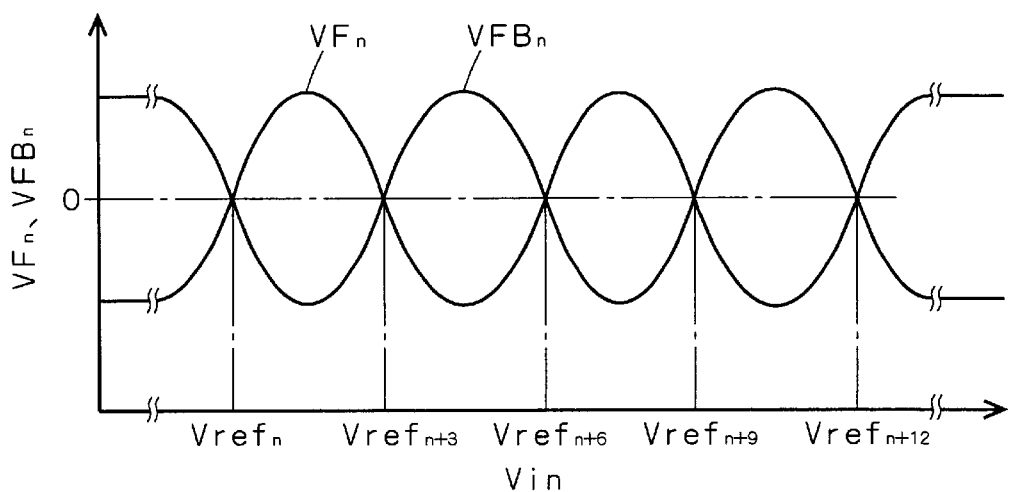
FIG. 18 is a graph showing operation of the folding circuit.
Figure 21:
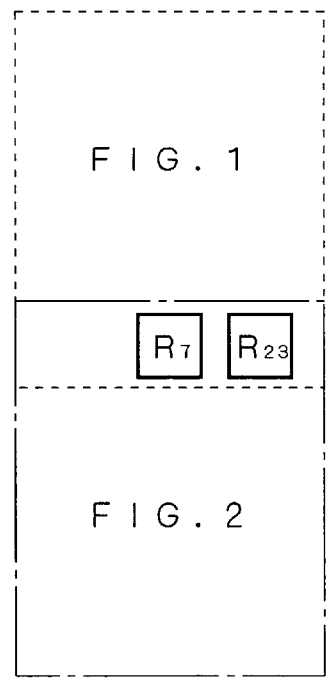
FIG. 21 is an explanation diagram showing the positional relation between FIGS. 1 and 2.

FIGS. 1 and 2 are related as shown in the explanation diagram of FIG. 21. The entire configuration is the same as that shown in FIGS. 15 and 16, which includes the folding circuit 72 as a reference conversion voltage output portion, the interpolation circuit 73 as an intermediate voltage generating portion, and the comparator group 74, the preencoder 75, and the encoder 76 as a digital data output portion.

Figure 19:
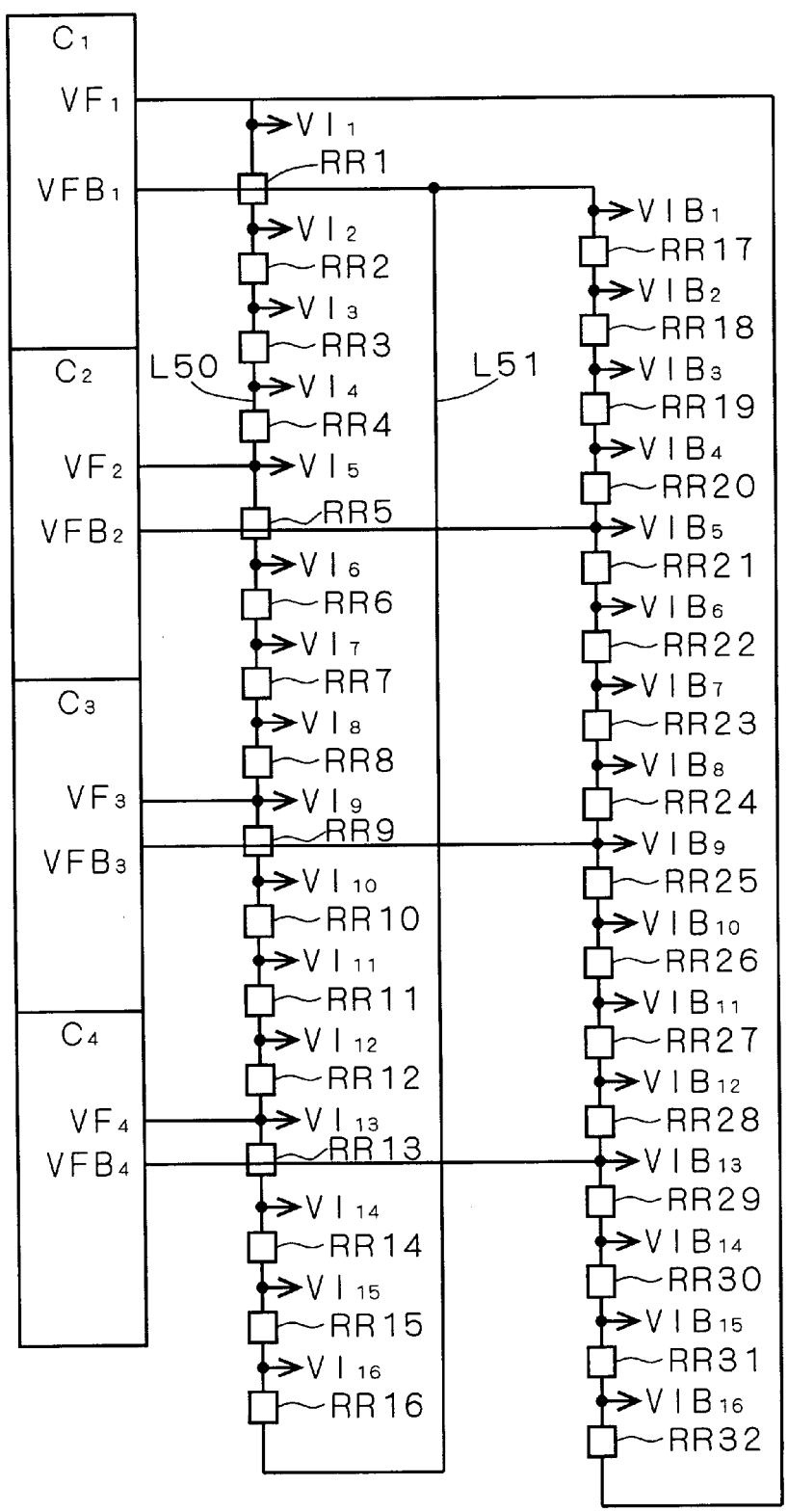
FIGS. 19 and 20 are explanation diagrams showing (first and second) internal layout configurations of the interpolation circuit.
Figure 20:
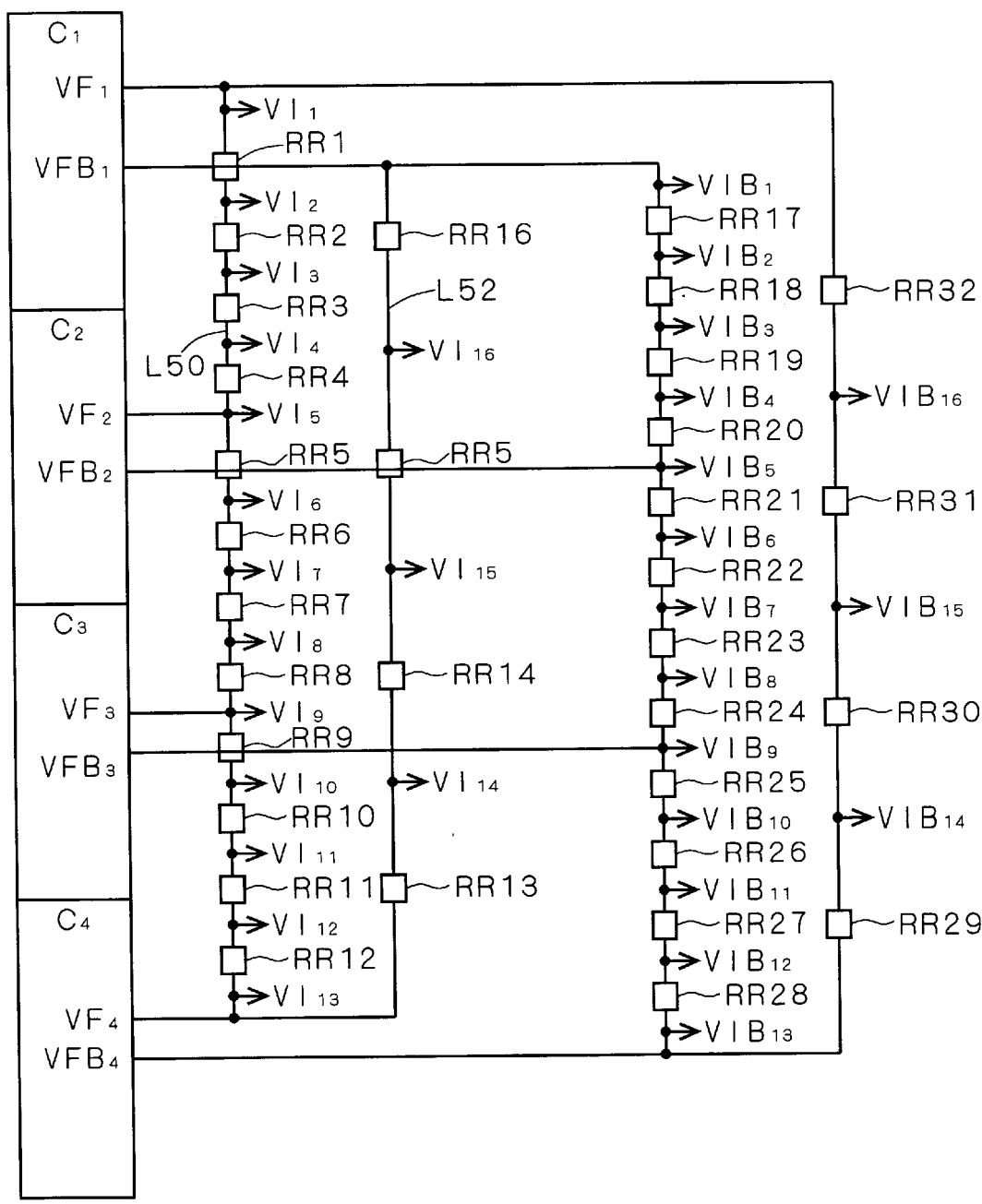

Like the conventional examples shown in FIGS. 19 and 20, the interpolation circuit of FIGS. 1 and 2 is shown as an example of circuit configuration which receives four signal (reference conversion voltage) pairs (the output signals $VF_n$ and $VFB_n$ (n=1, 2, 3, 4)) outputted from the blocks $C_1$ to $C_4$ as sub-circuits in the folding circuit in the previous stage, divides the voltage ranges of the output signals to 1/4 to increase the information fourfold on the basis of the four signal pairs, and generates 16 signal (conversion voltage) pairs $VI_k$ and $VIB_k$ (k=1, 2 ... 16).

The output signals $VF_n$ and $VFB_n$ outputted from the folding circuit 72 are complementary signals with respect to each other, and the output signals $VF_1$ to $VF_4$ and the output signals $VFB_1$ to $VFB_4$ are both generated at phases uniformly shifted in the order of 1 to 4 within one period.

As shown in FIGS. 1 and 2, the interpolation circuit of the first preferred embodiment has resistor elements $R_1$ to $R_{32}$ (for convenience, an arbitrary one of the resistor elements will be referred to as a resistor element R) and 32 wiring L10 as resistor connecting wiring for connecting the resistor elements R and R.

The output signals $VF_n$ and $VFB_n$ from the circuit blocks $C_n$ (n=1, 2, 3, 4) in the folding circuit are respectively connected to the input terminals $N_n$ and $NB_n$ as input signals to the interpolation circuit.

The 32 resistor elements $R_1$ to $R_{32}$ are arranged in two lines, each line including 16 resistor elements arranged vertically. One of the lines (the line on the left in FIGS. 1 and 2) includes $R_3, R_2, R_4, R_1, R_5, R_{32}, R_6, R_{31}, R_7, R_{30}, R_8, R_{29}, R_9, R_{28}, R_{10}, R_{27}$ arranged in this order.

The other line (the line on the right in FIGS. 1 and 2) includes $R_{19}, R_{18}, R_{20}, R_{17}, R_{21}, R_{16}, R_{22}, R_{15}, R_{23}, R_{14}, R_{24}, R_{13}, R_{25}, R_{12}, R_{26}, R_{11}$ arranged in this order.

A resistance unit including four sets of resistor elements R and wiring L10 connected in series is provided between the input terminals $N_i$ and $N_{i+1}$ (i=1, 2, 3), between the input terminals $NB_i$ and $NB_{i+1}$ (i=1, 2, 3), between $N_4$ and $NB_1$, and between $NB_4$ and $N_1$, each resistor element R having an output terminal $P_k$ or $PB_k$ (k=1, 2 ... 16) at its one end (an arbitrary one will be referred to as an output terminal P or an output terminal PB for convenience). The signals $VI_k$ and $VIB_k$ are outputted from the output terminals $P_k$ and $PB_k$.

The conversion voltages or the output signals $VI_k$ and $VIB_k$ (k=1, 2 ... 16) and the reference conversion voltages or the input signals $VF_n$ and $VFB_n$ (n=1, 2, 3, 4) are related as shown in Table 3 described before. As shown in Table 3, the output signals $VI_k$ and $VIB_k$ with k=2, 3, 4, 6, 7, 8, 10, 11, 12, 14, 15, 16 correspond to the intermediate voltages. The output signals $VI_k$ and $VIB_k$ with k=1, 5, 9, 13 correspond to the input signals $VF_n$ and $VFB_n$, or the reference conversion voltages themselves.

Table 7 shows the routes between the sections defined by the above-described two input terminals N and NB with the resistor elements R and the output terminals $P_k$ or $PB_k$.

| Section | Route |
|---|---|
| between $N_1$ and $N_2$ | $N_1$-$P_1$-$R_1$-$P_2$-$R_2$-$P_3$-$R_3$-$P_4$-$R_4$-$P_5$-$N_2$ |
| between $N_2$ and $N_3$ | $N_2$-$P_5$-$R_5$-$P_6$-$R_6$-$P_7$-$R_7$-$P_8$-$R_8$-$P_9$-$N_3$ |
| between $N_3$ and $N_4$ | $N_3$-$P_9$-$R_9$-$P_{10}$-$R_{10}$-$P_{11}$-$R_{11}$-$P_{12}$-$R_{12}$-$P_{13}$-$N_4$ |
| between $N_4$ and $NB_1$ | $N_4$-$P_{13}$-$R_{13}$-$P_{14}$-$R_{14}$-$P_{15}$-$R_{15}$-$P_{16}$-$R_{16}$-$PB_1$-$NB_1$ |
| between $NB_1$ and $NB_2$ | $NB_1$-$PB_1$-$R_{17}$-$PB_2$-$R_{18}$-$PB_3$-$R_{19}$-$PB_4$-$R_{20}$-$PB_5$-$NB_2$ |
| between $NB_2$ and $NB_3$ | $NB_2$-$PB_5$-$R_{21}$-$PB_6$-$R_{22}$-$PB_7$-$R_{23}$-$PB_8$-$R_{24}$-$PB_9$-$NB_3$ |
| between $NB_3$ and $NB_4$ | $NB_3$-$PB_9$-$R_{25}$-$PB_{10}$-$R_{26}$-$PB_{11}$-$R_{27}$-$PB_{12}$-$R_{28}$-$PB_{13}$-$NB_4$ |
| between $NB_4$ and $N_1$ | $NB_4$-$PB_{13}$-$R_{29}$-$PB_{14}$-$R_{30}$-$PB_{15}$-$R_{31}$-$PB_{16}$-$R_{32}$-$P_1$-$N_1$ |

Figure 3:
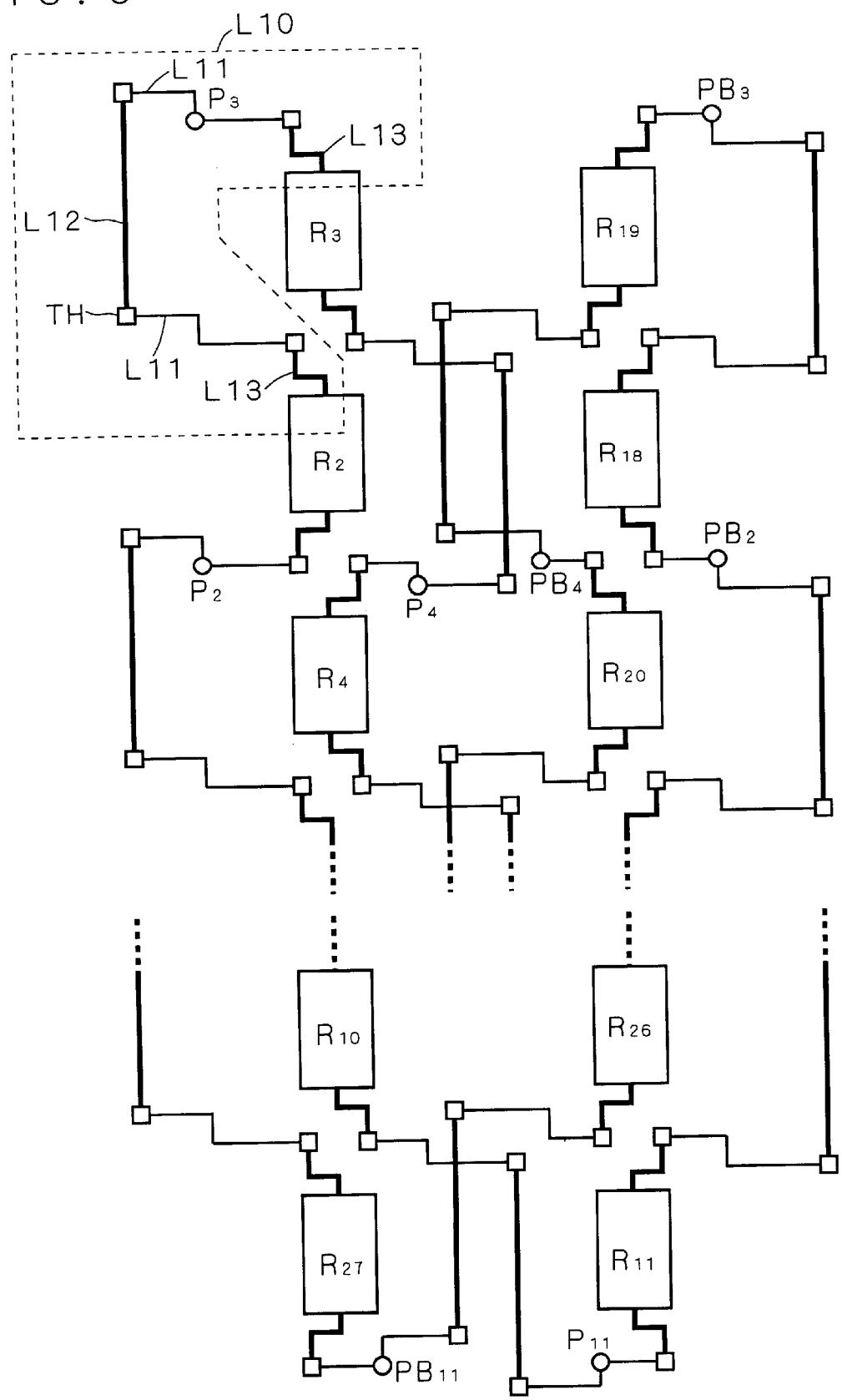
FIG. 3 is an explanation diagram showing part of FIGS. 1 and 2 in greater detail.

FIG. 3 shows part of FIGS. 1 and 2 in an enlarged manner. The wiring L10 is composed of two partial wiring L11 formed in a first layer and one partial wiring L12 and two partial wiring L13 formed in a second layer, and the individual partial wiring are electrically connected through the through holes TH (shown by □ in the diagrams). For example, in the wiring L10 between the resistor elements $R_2$ and $R_3$ having the output terminal $P_3$, the partial wiring L13, L11, L12, L11, L13 are connected in series in this order through the through holes TH.

The directions of the partial wiring L11 and L13 are changed in accordance with the connecting direction of the wiring L10 so that the wiring L10 have equal length in any part.

Figure 4:
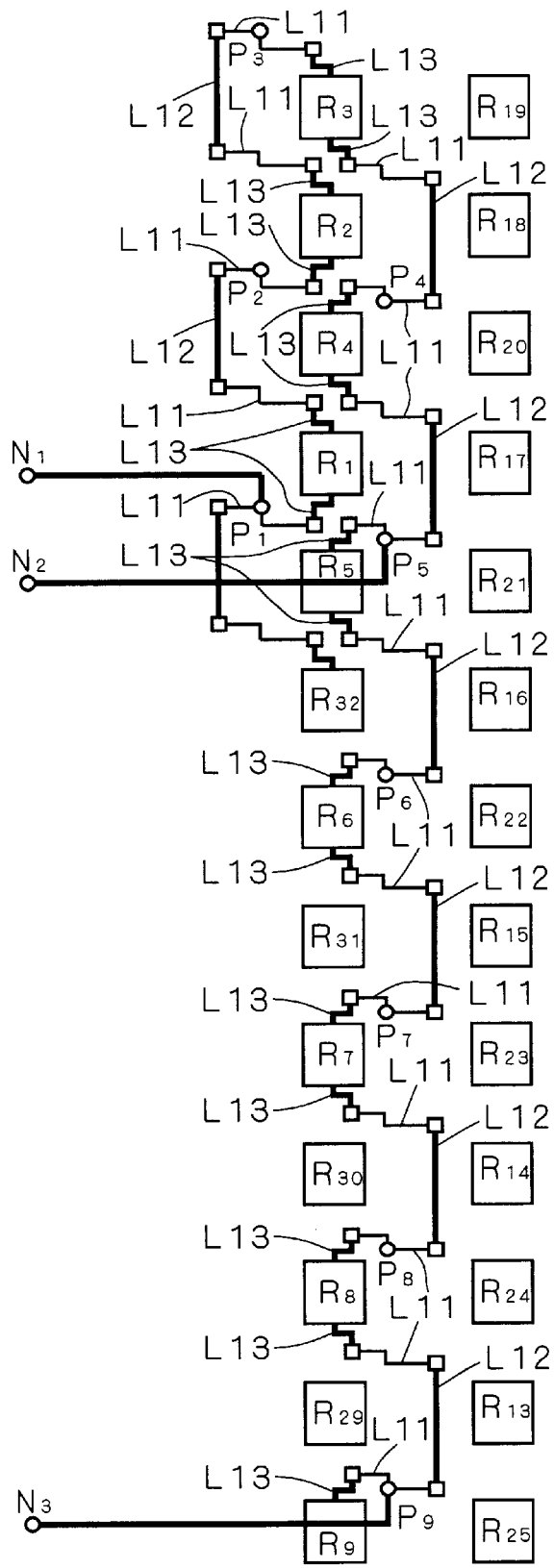
FIG. 4 is an explanation diagram showing the connections between part of the input terminals in FIGS. 1 and 2.

FIG. 4 is an explanation diagram showing the connections between the input terminals $N_1$ and $N_2$ and the input terminals $N_2$ and $N_3$ through the partial wiring L11 to L13. As shown in this diagram, mainly, the resistor elements R and R are connected through the wiring L10 over two resistor elements therebetween; for example, between the resistor elements $R_1$ and $R_2$, the partial wiring L11 and L13 are extended to the left in the diagram, and between the resistor elements $R_3$ and $R_4$, the partial wiring L11 and L13 are extended to the right in thee diagram.

Each wiring L10 is formed of a combination of partial wiring of {2×L11, L12, 2×L13}. That is to say, all the wiring L10 have equal width and length, and therefore equal area, so that they have equal parasitic capacitance component. Also, the through holes in the respective wiring L10 have equal resistance component, so that the sum total of the resistance components is equal in all the wiring L10.

Accordingly, in the interpolation circuit of the first preferred embodiment, the division is uniform between the output voltages $VI_y$ and $VIB_y$ (y=2, 3, 4, 6, 7, 8, 10, 11, 12) and $VI_z$ and $VIB_z$ (z=14, 15, 16), and then the accuracy of the output voltages is not deteriorated.

Furthermore, all the output terminals P and output terminals PB are regularly provided at intermediate points of the partial wiring L11, so that the output terminals P (PB) and P (PB) connected through one resistor element R can substantially be regarded as connected through one resistor element R and one wiring L10. Therefore the uniformity is not lost by the position of the output terminals P and the output terminals PB.

The wiring between the output signals $VF_n$ and $VFB_n$ of the circuit blocks $C_n$ (n=1 to 4) in the folding circuit and the input terminals $N_n$ and $NB_n$ of the interpolation circuit are formed under almost the same conditions even in conventional configurations, and therefore they do not deteriorate the uniformity practically.

Although it is preferred that the wiring lengths between the input terminals $N_n$ and $NB_n$ and the corresponding output terminals P and PB are equal, the uniformity is hardly deteriorated if the wiring resistance is set sufficiently low even with the different wiring lengths.

When the resistance value of each resistor element $R_1$ to $R_{32}$ is R, the resistance component of each wiring L10 is $r_1$, and the sum of the parasitic capacitance of resistor element R and the parasitic capacitance of wiring L10 is $C_1$, then the sum total of the resistance components connected between the input terminals $N_i$ and $N_{i+1}$ (i=1, 2, 3) of the interpolation circuit, between the input terminals $NB_i$ and $NB_{i+1}$ (i=1, 2, 3), between $N_4$ and $NB_1$, and between $NB_4$ and $N_1$, is always $4\times(R+r_1)$, and the sum total of the capacitance components is always $4C_1$.

As a result, the output signals of the interpolation circuit take almost equal time to vary, thus considerably reducing the error caused in the outputs of the comparators.

Thus the A/D converter of the first preferred embodiment using the interpolation circuit of this layout can considerably improve the A/D conversion accuracy. Furthermore, in respect of layout, the resistor elements can be arranged vertically in two lines each including 16 elements, so that the area can be reduced to achieve higher degree of integration as compared with the conventional layout shown in FIG. 20.

Further, since the entire structure of the folding circuit ($C_1$ to $C_4$) of the first preferred embodiment is integrally formed in respect of layout, the cost of the entire device can be reduced by using an already-existing configuration as the folding circuit.

Although the first preferred embodiment has shown an interpolation circuit for increasing the amount of information fourfold, an interpolation circuit for increasing the amount of information twofold can be realized by connecting two sets of resistor elements R and wiring L10 in series between the input terminals. Also, an interpolation circuit for increasing the amount of information eight fold can be realized by connecting eight sets of resistor elements R and wiring L.

<Second Preferred Embodiment>

Figure 5:
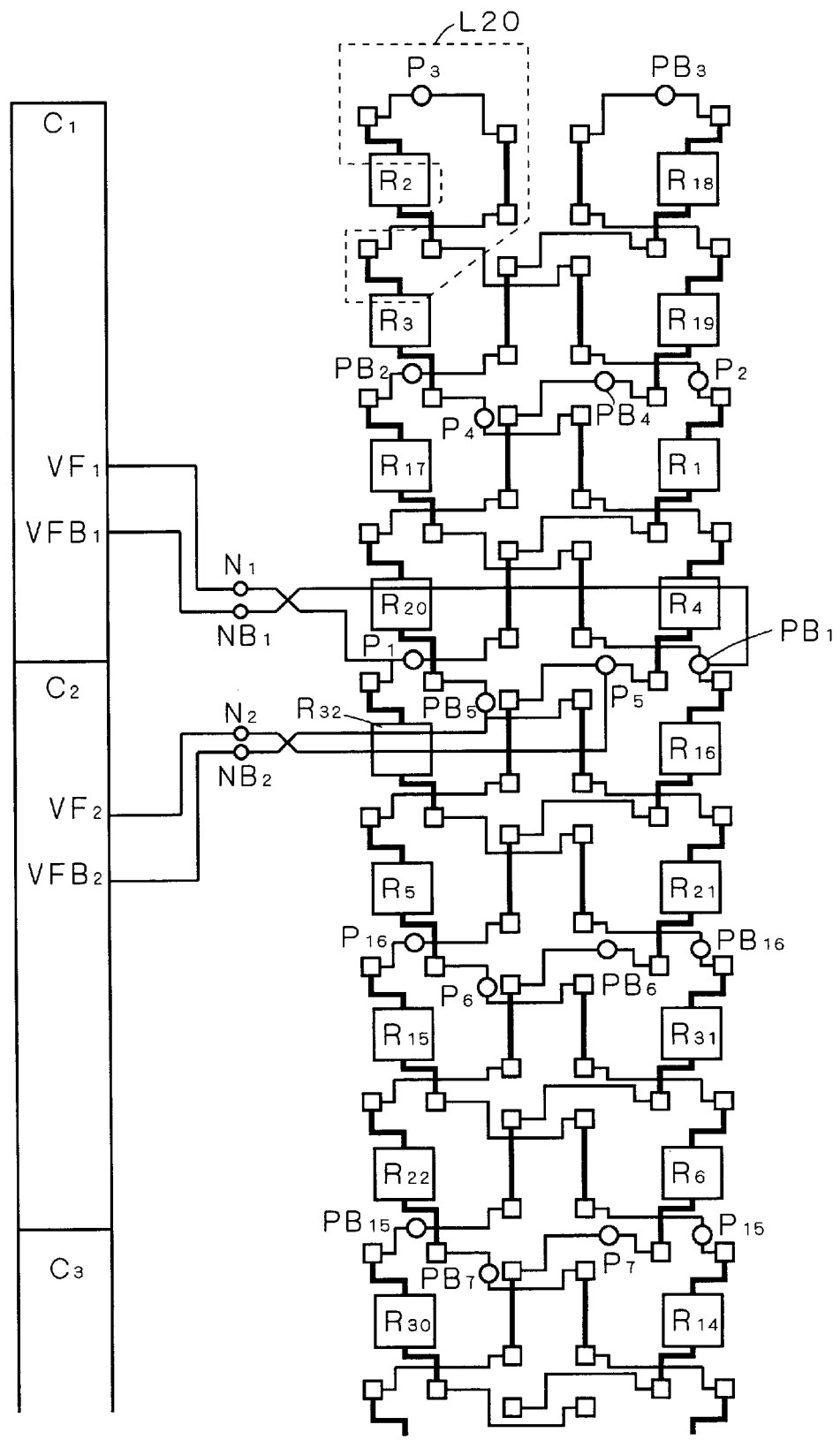
FIGS. 5 and 6 are explanation diagrams showing the layout configuration of an interpolation circuit in an A/D converter according to a second preferred embodiment.
Figure 6:
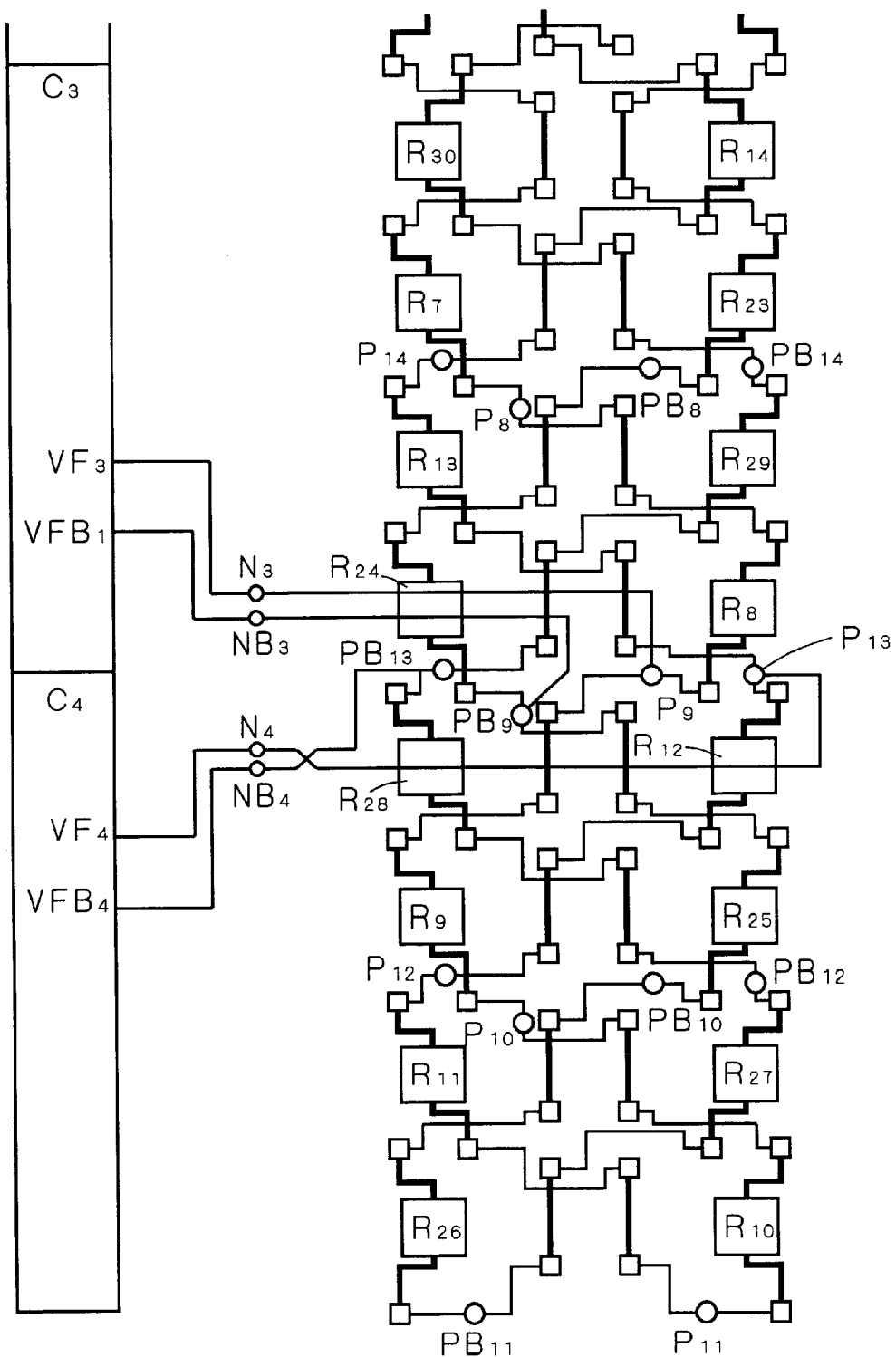
Figure 22:
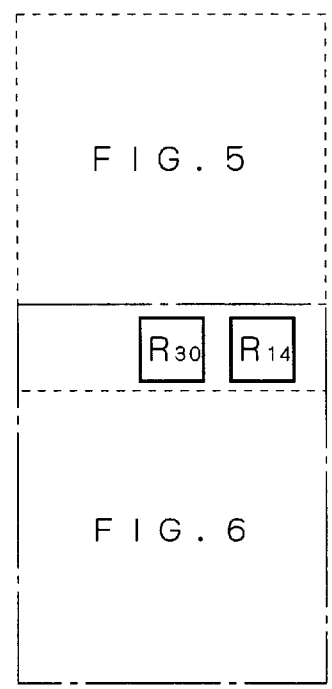
FIG. 22 is an explanation diagram showing the positional relation between FIGS. 5 and 6.

FIGS. 5 and 6 are explanation diagrams showing the layout of an interpolation circuit of an A/D converter according to a second preferred embodiment of the present invention. FIGS. 5 and 6 are related as shown in the explanation diagram of FIG. 22. The entire structure is the same as that shown in FIGS. 15 and 16.

Like the interpolation circuit of the first preferred embodiment shown in FIGS. 1 and 2, the interpolation circuit of the second preferred embodiment of FIGS. 5 and 6 is shown as an example of circuit configuration which receives four signal pairs (the output signals $VF_n$ and $VFB_n$ (n=1, 2, 3, 4)), divides the voltage ranges of the output signals to 1/4 to increase the information fourfold on the basis of the four signal pairs, and generates 16 signal pairs $VI_k$ and $VIB_k$ (k=1, 2 . . . 16).

As shown in FIGS. 5 and 6, the interpolation circuit of the second preferred embodiment has resistor elements $R_1$ to $R_{32}$ and 32 wiring L20 as resistor connecting wiring for connecting the resistor elements R and R.

The output signals $VF_n$ and $VFB_n$ from the circuit blocks $C_n$ (n=1, 2, 3, 4) in the folding circuit are respectively connected to the input terminals $N_n$ and $NB_n$ as input signals to the interpolation circuit.

The 32 resistor elements $R_1$ to $R_{32}$ are arranged in two lines, each line including 16 resistor elements arranged vertically. One of the lines (the line on the left in FIGS. 5 and 6) includes $R_2$, $R_3$, $R_{17}$, $R_{20}$, $R_{32}$, $R_5$, $R_{15}$, $R_{22}$, $R_{30}$, $R_7$, $R_{13}$, $R_{24}$, $R_{28}$, $R_9$, $R_{11}$, $R_{26}$ arranged in this order.

The other line (the line on the right in FIGS. 5 and 6) includes $R_{18}$, $R_{19}$, $R_1$, $R_4$, $R_{16}$, $R_{21}$, $R_{31}$, $R_6$, $R_{14}$, $R_{23}$, $R_{29}$, $R_8$, $R_{12}$, $R_{25}$, $R_{27}$, $R_{10}$ arranged in this order.

A resistance unit including four sets of resistor elements R and wiring L20 connected in series is provided between the input terminals $N_i$ and $N_{i+1}$ (i=1, 2, 3), between the input terminals $NB_i$ and $NB_{i+1}$ (i=1, 2, 3), between $N_4$ and $NB_1$, and between $NB_4$ and $N_1$, each resistor element R having an output terminal $P_k$ or $PB_k$ (k=1, 2 ... 16) at its one end. The signals $VI_k$ and $VIB_k$ are outputted from the output terminals $P_k$ and $PB_k$.

The output signals $VI_k$ and $VIB_k$ (k=1, 2 ... 16) and the input signals $VF_n$ and $VFB_n$ (n=1, 2, 3, 4) are related as shown in Table 3 described before.

The routes between the sections defined by the above-described two input terminals N and NB can be represented with the resistor elements R and the output terminals $P_k$ or $PB_k$ as shown in Table 7 of the first preferred embodiment.

Figure 7:
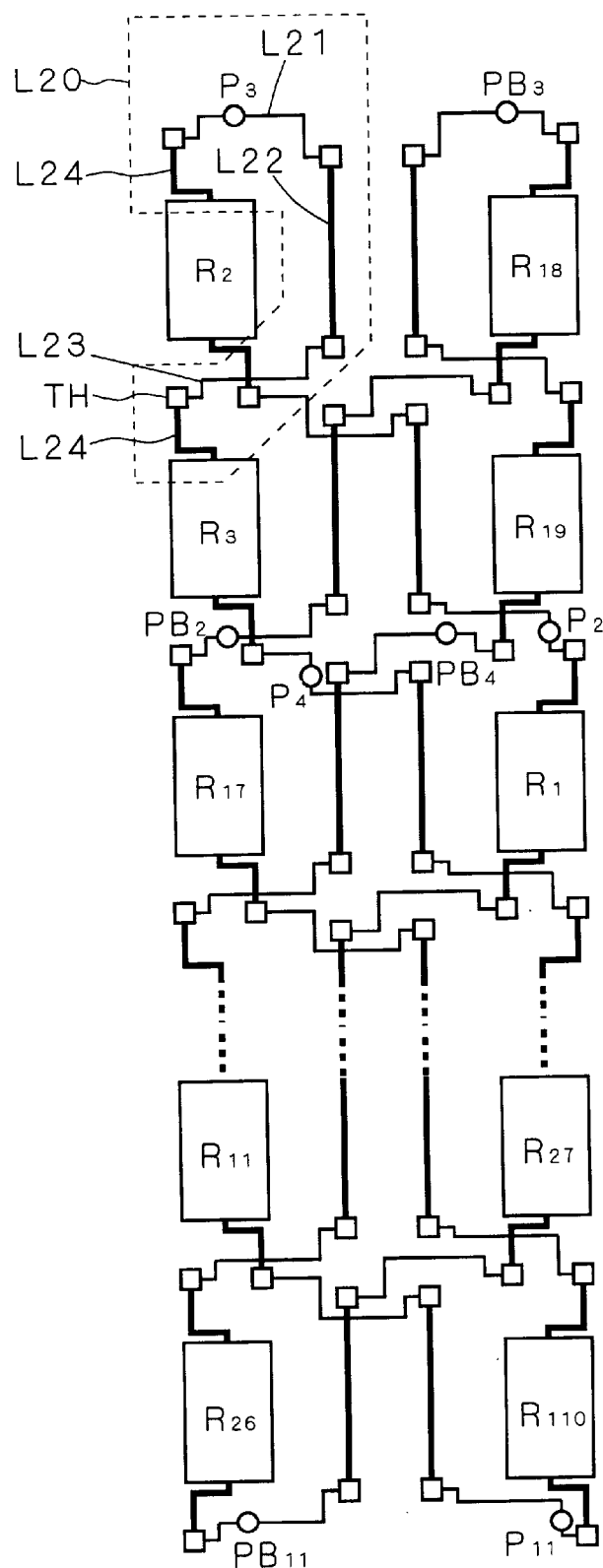
FIG. 7 is an explanation diagram showing part of FIGS. 5 and 6 in greater detail.

FIG. 7 shows part of FIGS. 5 and 6 in an enlarged manner. The wiring L20 is composed of partial wiring L21 and L23 formed in a first layer and a partial wiring L22 and two partial wiring L24 formed in a second layer, and the individual partial wiring are electrically connected through the through holes TH (shown by □ in the diagrams). For example, in the wiring L20 between the resistor elements $R_2$ and $R_3$ having the output terminal $P_3$, the partial wiring L24, L21, L22, L23, L24 are connected in series in this order through the through holes TH.

The directions of the partial wiring L21, L23, and L24 are changed in accordance with the connecting direction of the wiring L20 so that the wiring L20 have equal length in any part.

Figure 8:
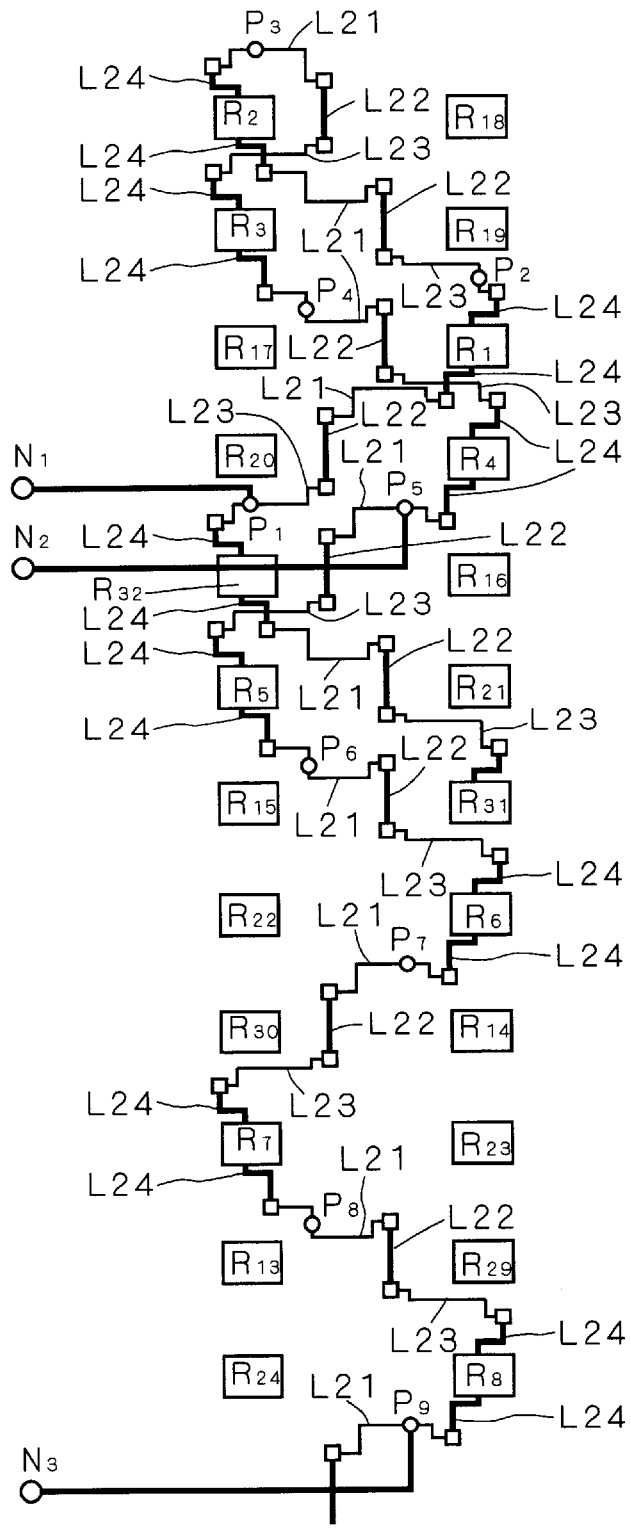
FIG. 8 is an explanation diagram showing the connections between part of the input terminals in FIGS. 5 and 6.

FIG. 8 is an explanation diagram showing the connections between the input terminals $N_1$ and $N_2$ and the input terminals $N_2$ and $N_3$ through the partial wiring L21 to L24. As shown in this diagram, the resistor elements R and R are connected through the wiring L20 {L21, L22, L23, 2×L24}; for example, between the resistor elements $R_1$ and $R_2$ provided in different lines at an interval corresponding to one resistor element R, the partial wiring L21 and L23 are extended in the same direction, and between the adjacent resistor elements $R_2$ and $R_3$ provided in the same line, the partial wiring L21 and L23 are extended in different directions.

Each wiring L20 is formed of a combination of partial wiring of {L21, L22, L23, 2×L24}. That is to say, all the wiring L20 have equal width and length, and therefore equal area, so that they have equal parasitic capacitance component. Also, the through holes in the respective wiring L20 have equal resistance component, so that the sum total of the resistance components is equal in all the wiring L20.

Accordingly, in the interpolation circuit of the second preferred embodiment, the division is uniform between the output voltages $VI_y$ and $VIB_y$ (y=2, 3, 4, 6, 7, 8, 10, 11, 12) and $VI_z$ and $VIB_z$ (z=14, 15, 16), and then the accuracy of the output voltages is not deteriorated.

Furthermore, all the output terminals P and output terminals PB are regularly provided at intermediate points of the partial wiring L21 or L23, so that the output terminals P (PB) and P (PB) connected through one resistor element R can substantially be regarded as connected through one resistor element R and one wiring L20. Therefore the uniformity is not lost by the position of the out put terminals P and the output terminals PB.

For the wiring from the output terminals P, PB to the circuit blocks $C_n$ (n=1 to 4) in the folding circuit, they practically do not deteriorate the uniformity for the reason described in the first preferred embodiment.

When the resistance component of each wiring L20 is $r_2$, and the sum of the parasitic capacitance of resistor element R and the parasitic capacitance of wiring L20 is $C_2$, then the sum total of the resistance components connected between the input terminals $N_i$ and $N_{i+1}$ (i=1, 2, 3) of the interpolation circuit, between the input terminals $NB_i$ and $NB_{i+1}$ (i=1, 2, 3), between $N_4$ and $NB_1$, and between $NB_4$ and $N_1$, is always $4 \times (R+r_2)$, and the sum total of the capacitance components is always $4C_2$.

As a result, the output signals of the interpolation circuit change in almost equal time length, thus considerably reducing the error caused in the outputs of the comparators.

Thus the A/D converter of the second preferred embodiment using the interpolation circuit of this layout can considerably improve the A/D conversion accuracy. Furthermore, in respect of layout, the resistor elements can be arranged vertically in two lines each including 16 elements, so that the area can be reduced to achieve higher degree of integration as compared with the conventional layout shown in FIG. 20.

Further, as in the first preferred embodiment, since the entire structure of the folding circuit of the second preferred embodiment is integrally formed in respect of layout, the cost of the entire device can be reduced by using an already-existing configuration as the folding circuit.

Although the second preferred embodiment has shown an interpolation circuit for increasing the amount of information fourfold, an interpolation circuit for increasing the amount of information twofold can be realized by connecting two sets of resistor elements R and wiring L20 in series between the input terminals. Also, an interpolation circuit for increasing the amount of information eight fold can be realized by connecting eight sets of resistor elements R and wiring L.

<Third Preferred Embodiment>

Figure 9:
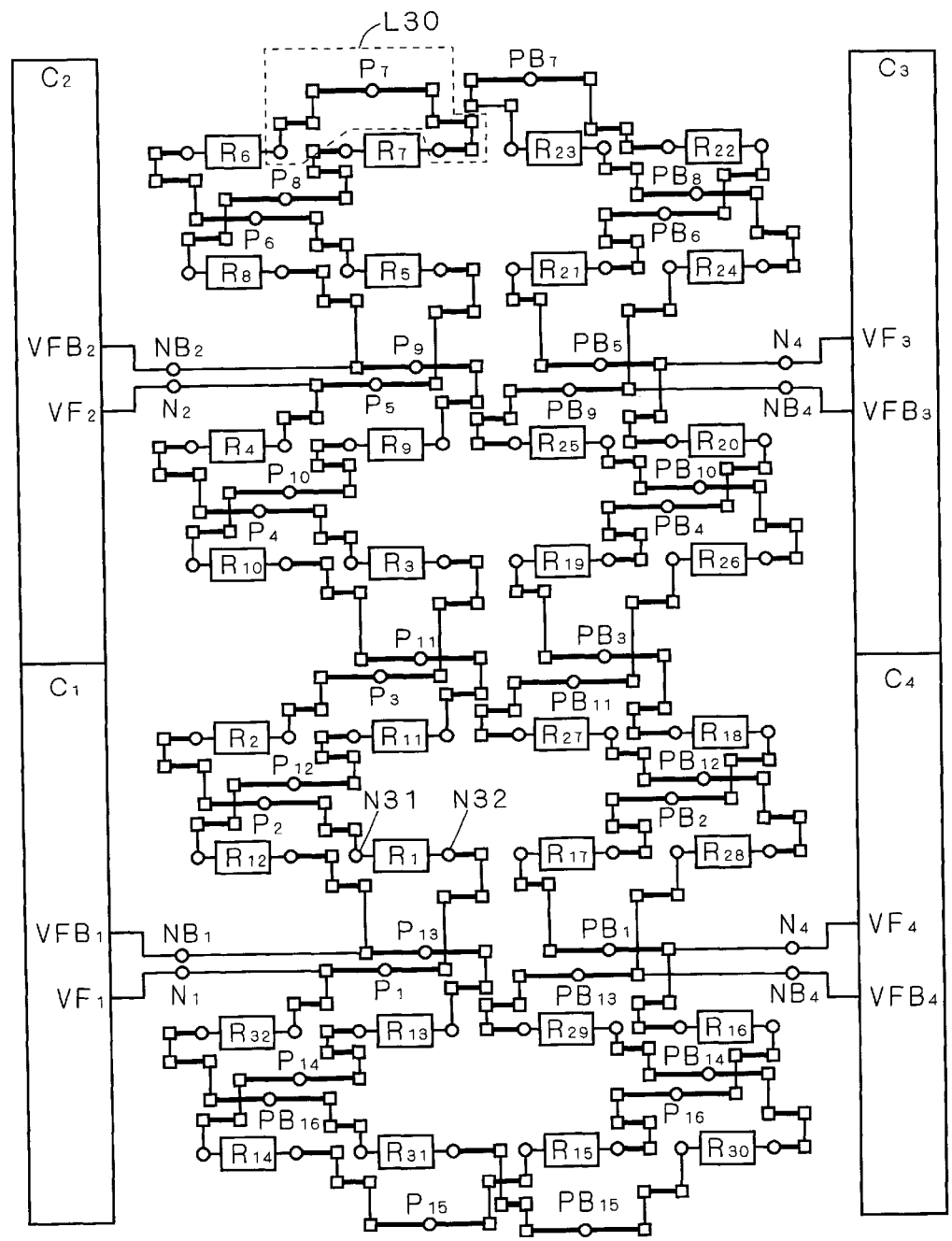
FIG. 9 is an explanation diagram showing the layout configuration of an interpolation circuit in an A/D converter according to a third preferred embodiment.

FIG. 9 is an explanation diagram showing the layout of an interpolation circuit in an A/D converter according to a third preferred embodiment of the present invention. The entire configuration is the same as that shown in FIGS. 15 and 16. Like the interpolation circuit of the first preferred embodiment shown in FIGS. 1 and 2, the interpolation circuit of the third preferred embodiment of FIG. 9 is shown as an example of circuit configuration which receives four signal pairs (the output signals $VF_n$ and $VFB_n$ (n=1, 2, 3, 4)), divides the voltage ranges of the output signals to 1/4 to increase the information fourfold on the basis of the four signal pairs, and generates 16 signal pairs $VI_k$ and $VIB_k$ (k=1, 2 ... 16).

As shown in FIG. 9, the interpolation circuit of the third preferred embodiment has resistor elements $R_1$ to $R_{32}$ and 32 wiring L30 as resistor connecting wiring for connecting the resistor elements R and R.

As shown in FIG. 9, the circuit blocks $C_n$ (n=1, 2, 3, 4) in the folding circuit are separated on both sides of the interpolation circuit, with two blocks on each side ($C_1$ and $C_2$, and $C_3$ and $C_4$).

The output signals $VF_n$ and $VFB_n$ from the circuit blocks $C_n$ (n=1, 2, 3, 4) in the folding circuit are respectively connected to the input terminals $N_n$ and $NB_n$ as input signals to the interpolation circuit.

The 32 resistor elements $R_1$ to $R_{32}$ are arranged in four lines, each line including eight resistor elements arranged vertically, in which, mainly, the resistor elements R, R located in obliquely separated positions are connected through the wiring L30. The resistor elements $R_1$ to $R_{32}$ have connecting terminals N31 and N32 provided under completely the same conditions on their respective both ends.

Among the 32 resistor elements $R_1$ to $R_{32}$, the first line (the leftmost line in FIG. 9) includes $R_6$, $R_8$, $R_4$, $R_{10}$, $R_2$, $R_{12}$, $R_{32}$, $R_{14}$ arranged in this order.

The second line (the second line from the left in FIG. 9) includes $R_7$, $R_5$, $R_9$, $R_3$, $R_{11}$, $R_1$, $R_{13}$, $R_{31}$ arranged in this order.

The third line (the third line from the left in FIG. 9) includes $R_{23}$, $R_{21}$, $R_{25}$, $R_{19}$, $R_{27}$, $R_{17}$, $R_{29}$, $R_{15}$ arranged in this order.

The fourth line (the rightmost line in FIG. 9) includes $R_{22}$, $R_{24}$, $R_{20}$, $R_{26}$, $R_{18}$, $R_{28}$, $R_{16}$, $R_{30}$ arranged in this order.

A resistance unit including four sets of resistor elements R and wiring L30 connected in series is provided between the input terminals $N_i$ and $N_{i+1}$ (i=1, 2, 3), between the input terminals $NB_i$ and $NB_{i+1}$ (i=1, 2, 3), between $N_4$ and $NB_1$, and between $NB_4$ and $N_1$, each resistor element R having an output terminal $P_k$ or $PB_k$ (k=1, 2 . . . 16) at its one end. The signals $VI_k$ and $VIB_k$ are outputted respectively from the output terminals $P_k$ and $PB_k$.

In the interpolation circuit, the input terminals $N_1$, $NB_1$, and $N_4$, $NB_4$ are located in almost the same position in the vertical direction, and the input terminals $N_2$, $NB_2$, and $N_3$, $NB_3$ are located in almost the same position in the vertical direction.

The output signals $VI_k$ and $VIB_k$ (k=1, 2 . . . 16) and the input signals $VF_n$ and $VFB_n$ (n=1, 2, 3, 4) are related as shown in Table 3 described before.

The routes between the sections defined by the above-described two input terminals N and NB can be represented with the resistor elements R and the output terminals $P_k$ or $PB_k$ as shown in Table 7 described in the first preferred embodiment.

When the circuit blocks $C_n$ (n=1, 2, 3, 4) are arranged vertically in one line as in the first and second preferred embodiments, redundant regions are formed at the top and bottom of the interpolation circuit and the asymmetrical wiring further increase the redundant regions. Arranging the circuit blocks $C_1$ to $C_4$ as shown in FIG. 9 solves this inconvenience. That is to say, the arrangement of the blocks $C_1$ to $C_4$ shown in FIG. 9 reduces the redundant regions and improves the degree of integration.

Figure 10:
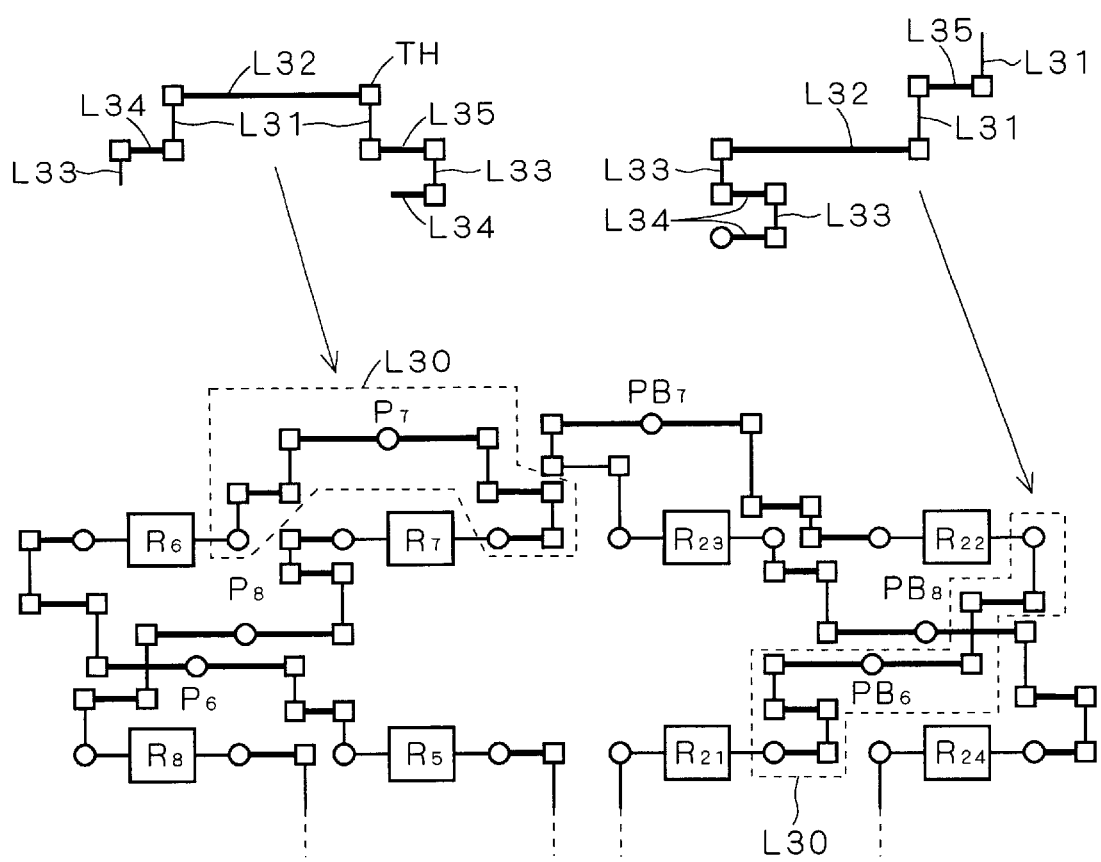
FIG. 10 is an explanation diagram showing part of FIG. 9 in greater detail.

FIG. 10 shows part of FIG. 9 in an enlarged manner. The wiring L30 is composed of two partial wiring L31 and two partial wiring L33 formed in a first layer and a partial wiring L32, two partial wiring L34 and a partial wiring L35 formed in a second layer, and the individual partial wiring are electrically connected through the through holes TH (shown by □ in the diagrams). For example, in the wiring L30 between the resistor elements $R_6$ and $R_7$ having the output terminal $P_7$, the partial wiring L33, L34, L31, L32, L31, L35, L33, L34 are connected in series in this order through the through holes TH.

The directions and the order of connection of the partial wiring L31 to L35 are changed in accordance with the connecting direction of the wiring L30 so that the wiring L30 have equal length in any part.

Figure 11:
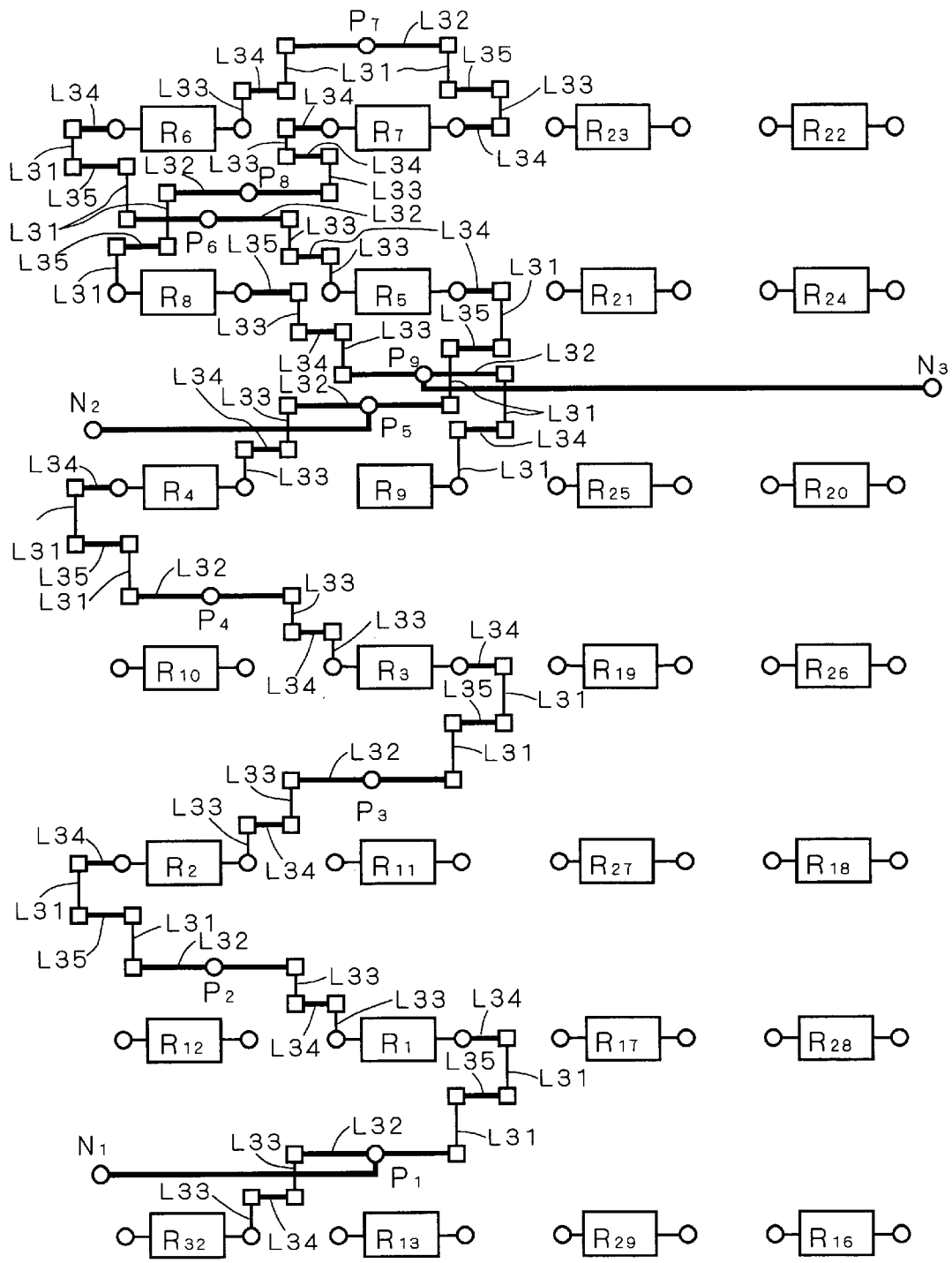
FIG. 11 is an explanation diagram showing the connections between part of the input terminals in FIG. 9.

FIG. 11 is an explanation diagram showing the connections between the input terminals $N_1$ and $N_2$ and the input terminals $N_2$ and $N_3$ through the partial wiring L31 to L35. As shown in this diagram, the resistor elements R, R are connected through the wiring L30 {2×L31, L32, 2×L33, 2×L34, L35}; for example, between the resistor elements $R_1$ and $R_2$ which are located in oblique direction in different lines, the two partial wiring L31 and two partial wiring L33 are all extended in the same direction, and between the resistor elements $R_6$ and $R_7$ adjacent in the same row direction in different lines, the two partial wiring L31 and two partial wiring 133 are extended in such directions that one of the partial wiring L31 and one of the partial wiring L33 cancel the other of the partial wiring L31 and the other of the partial wiring L33.

Each wiring L30 is formed of a combination of partial wiring of {2×L31, L32, 2×L33, 2×L34, L35}. That is to say, all the wiring L30 have equal width and length, and therefore equal area, so that they have equal parasitic capacitance component. Also, the through holes in the respective wiring L30 have equal resistance component, so that the sum total of the resistance components is equal in all the wiring L30.

Accordingly, in the interpolation circuit of the third preferred embodiment, the division is uniform between the output voltages $VI_y$ and $VIB_y$ (y=2, 3, 4, 6, 7, 8, 10, 11, 12) and $VI_z$ and $VIB_z$ (z=14, 15, 16), and then the accuracy of the output voltages is not deteriorated.

Furthermore, all the output terminals P and output terminals PB are regularly provided at intermediate points of the partial wiring L32, so that the output terminals P (PB) and P (PB) connected through one resistor element R can substantially be regarded as connected through one resistor element R and one wiring L30. Therefore the uniformity is not lost by the position of the output terminals P and the output terminals PB.

The wiring from the output terminals P, PB to the circuit blocks $C_n$ (n=1 to 4) in the folding circuit practically do not deteriorate the uniformity for the reason described in the first preferred embodiment.

When the resistance component of each wiring L30 is $r_3$, and the sum of the parasitic capacitance of resistor element R and the parasitic capacitance of wiring L30 is $C_3$, then the sum total of the resistance components connected between the input terminals $N_i$ and $N_{i+1}$ (i=1, 2, 3) of the interpolation circuit, between the input terminals $NB_i$ and $NB_{i+1}$ (i=1, 2, 3), between $N_4$ and $NB_1$, and between $NB_4$ and $N_1$, is always $4\times(R+r_3)$, and the sum total of the capacitance components is always $4C_3$.

As a result, the output signals of the interpolation circuit take almost equal time to vary, thus considerably reducing the error caused in the outputs of the comparators.

Thus the A/D converter of the third preferred embodiment using the interpolation circuit of this layout can considerably improve the A/D conversion accuracy.

Although the third preferred embodiment has shown an interpolation circuit for increasing the amount of information fourfold, an interpolation circuit for increasing the amount of information twofold can be realized by connecting two sets of resistor elements R and wiring L30 in series between the input terminals. Also, an interpolation circuit for increasing the amount of information eight fold can be realized by connecting eight sets of resistor elements R and wiring L.

<Fourth Preferred Embodiment>

Figure 12:
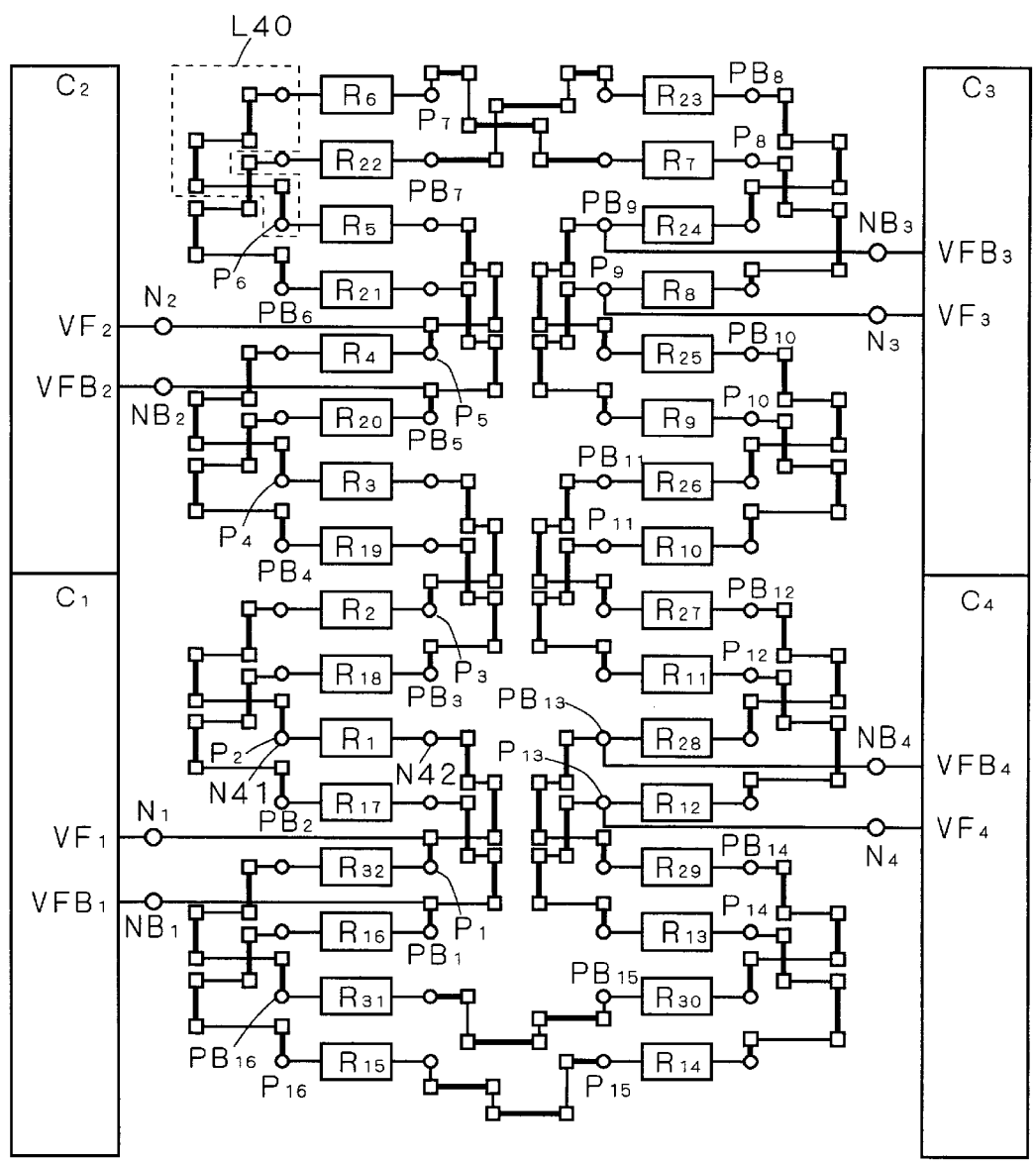
FIG. 12 is an explanation diagram showing the layout configuration of an interpolation circuit in an A/D converter according to a fourth preferred embodiment.

FIG. 12 is an explanation diagram showing the layout of an interpolation circuit in an A/D converter according to a fourth preferred embodiment of the present invention. The configuration of the entirety is the same as that shown in FIGS. 15 and 16. Like the interpolation circuit of the first preferred embodiment shown in FIGS. 1 and 2, the interpolation circuit of the fourth preferred embodiment of FIG. 12 is shown as an example of circuit configuration which receives four signal pairs (the output signals $VF_n$ and $VFB_n$ (n=1, 2, 3, 4)), divides the voltage ranges of the output signals to 1/4 to increase the information fourfold on the basis of the four signal pairs, and generates 16 signal pairs $VI_k$ and $VIB_k$ (k=1, 2 . . . 16).

As shown in this diagram, the interpolation circuit of the fourth preferred embodiment has resistor elements $R_1$ to $R_{32}$ and 32 wiring L40 as resistor connecting wiring for connecting the resistor elements R and R. Each resistor element $R_1$ to $R_{32}$ has connecting terminals N41 and N42 formed under completely the same conditions at their respective both ends.

As shown in FIG. 12, the circuit blocks $C_n$ (n=1, 2, 3, 4) in the folding circuit are separated on both sides of the interpolation circuit, with two blocks on each side ($C_1$ and $C_2$, and $C_3$ and $C_4$).

The output signals $VF_n$ and $VFB_n$ from the circuit blocks $C_n$ (n=1, 2, 3, 4) in the folding circuit are respectively connected to the terminals $N_n$ and $NB_n$ as input signals to the interpolation circuit.

The 32 resistor elements $R_1$ to $R_{32}$ are arranged in two lines, each line including 16 resistor elements arranged vertically. One of the lines (the line on the left in FIG. 12) includes $R_6, R_{22}, R_5, R_{21}, R_4, R_{20}, R_3, R_{19}, R_2, R_{18}, R_1, R_{17}, R_{32}, R_{16}, R_{31}, R_{15}$ arranged in this order.

The other line (the line on the right in FIG. 12) includes $R_{23}, R_7, R_{24}, R_8, R_{25}, R_9, R_{26}, R_{10}, R_{27}, R_{11}, R_{28}, R_{12}, R_{29}, R_{13}, R_{30}, R_{14}$ arranged in this order.

A resistance unit including four sets of resistor elements R and wiring L40 connected in series is provided between the input terminals $N_i$ and $N_{i+1}$ (i=1, 2, 3), between the input terminals $NB_i$ and $NB_{i+1}$ (i=1, 2, 3), between $N_4$ and $NB_1$, and between $NB_4$ and $N_1$, each resistor element R having an output terminal $P_k$ or $PB_k$ (k=1, 2 . . . 16) at its one end. The signals $VI_k$ and $VIB_k$ are outputted from the output terminal $P_k$ and $PB_k$.

In the interpolation circuit, the input terminals $N_1, NB_1$, and $N_4, NB_4$ are located in almost the same position in the vertical direction, and the input terminals $N_2, NB_2,$ and $N_3, NB_3$ are located in almost the same position in the vertical direction.

The output signals $VI_k$ and $VIB_k$ (k=1, 2 . . . 16) and the input signals $VF_n$ and $VFB_n$ (n=1, 2, 3, 4) are related as shown in Table 3 described before.

The routes between the sections defined by the above-described two input terminals N and NB can be represented with the resistor elements R and the output terminals $P_k$ or $PB_k$ as shown in Table 7 described in the first preferred embodiment.

When the circuit blocks $C_n$ (n=1, 2, 3, 4) are arranged vertically in one line as in the first and second preferred embodiments, redundant regions are formed at the top and bottom of the interpolation circuit and the asymmetrical wiring further increase the redundant regions. The arrangement shown in FIG. 12 solves this inconvenience. That is to say, arranging the blocks $C_1$ to $C_4$ as shown in FIG. 12 reduces the redundant regions and improves the degree of integration.

Figure 13:
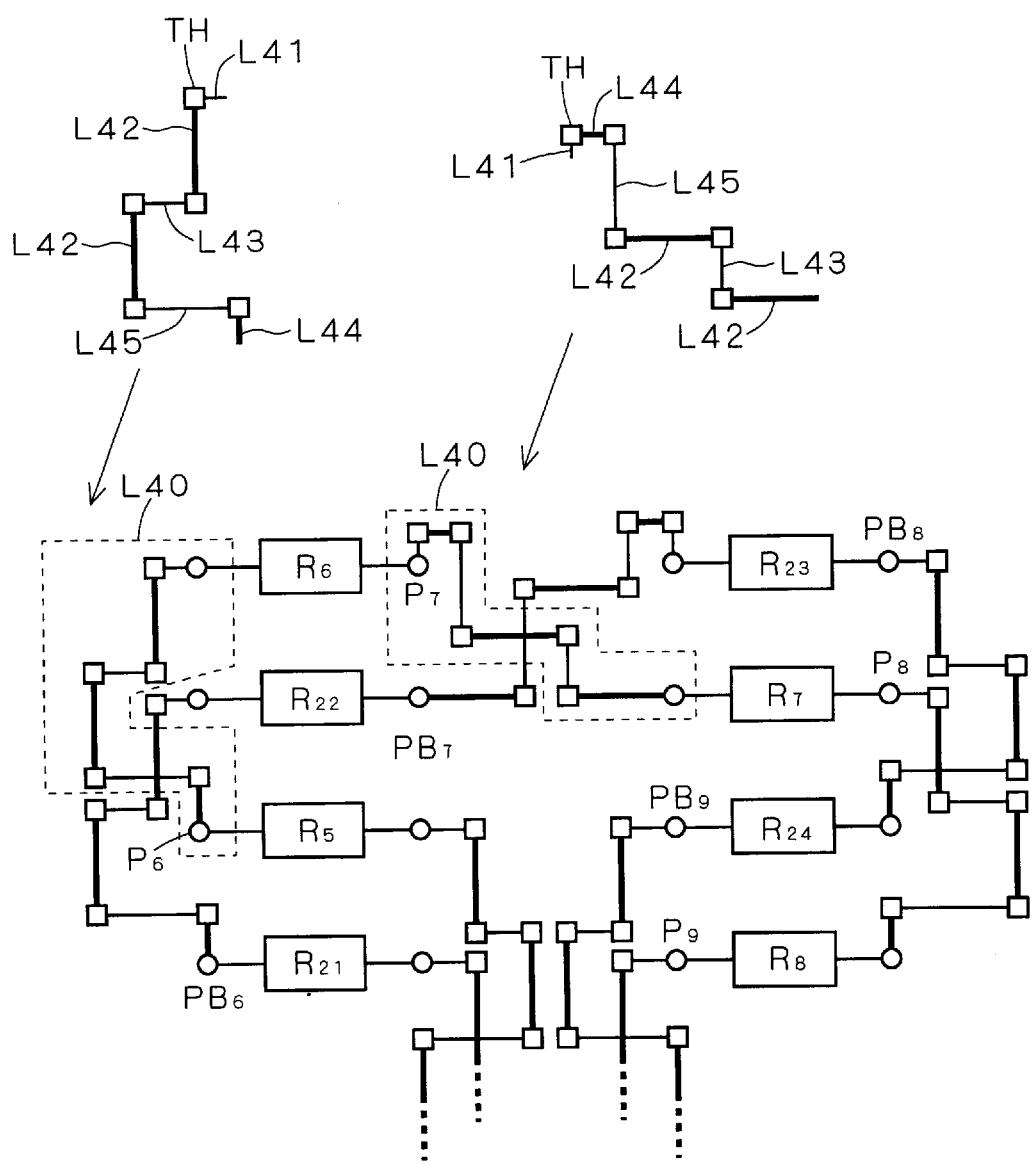
FIG. 13 is an explanation diagram showing part of FIG. 12 in greater detail.

FIG. 13 shows part of FIG. 12 in an enlarged manner. The wiring L40 is composed of partial wiring L41 and M43 and an wiring LA5 formed in a first layer and two partial wiring LA2 and one partial wiring L44 formed in a second layer, and the individual partial wiring are electrically connected through the through holes TH ( shown by □ in the diagrams). For example, in the wiring L40 between the resistor elements $R_5$ and $R_6$ having the output terminal $P_6$, the partial wiring L44, L45, L42, L43, L42, L41 are connected in series in this order through the through holes TH. In the wiring L40 between the resistor elements $R_6$ and $R_7$ having the output terminal $P_7$, the partial wiring L41, L44, L45, L42, L43, L42 are connected in series in this order through the through holes TH.

The directions and the order of connection of the partial wiring L41 to L45 are changed in accordance with the connecting direction of the wiring L40 so that the wiring L40 have equal length in any part.

Figure 14:
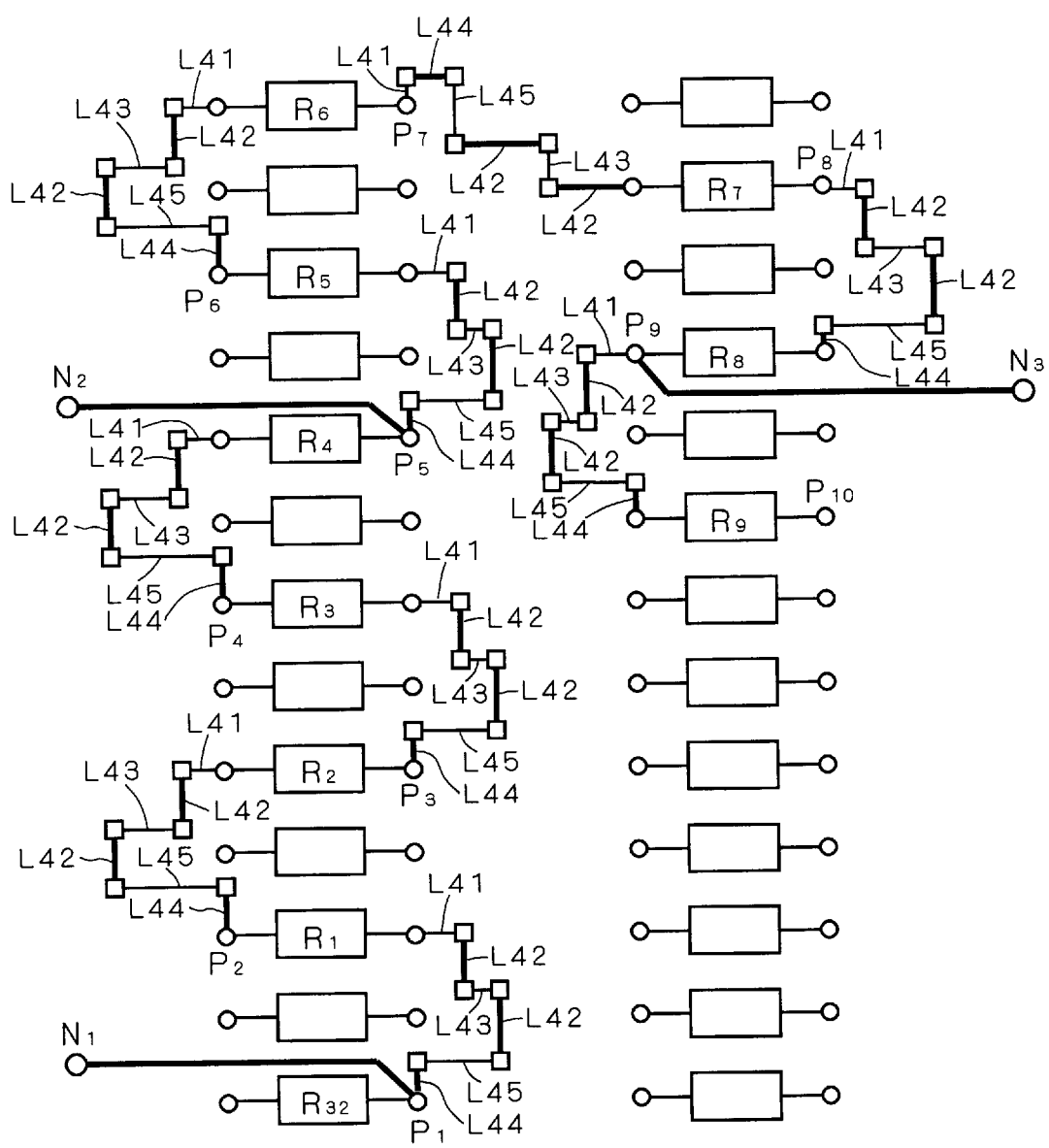
FIG. 14 is an explanation diagram showing the connections between part of the input terminals in FIG. 12.

FIG. 14 is an explanation diagram showing the connections between the input terminals $N_1$ and $N_2$ and the input terminals $N_2$ and $N_3$ through the partial wiring L41 to L45. As shown in this diagram, the resistor elements R and R are connected through the wiring L40 {L41, 2×L42, L43, L44, L45}; for example, between the resistor elements $R_1$ and $R_2$ provided in the same line with one resistor element R therebetween, the partial wiring L42, L42, and L44 are extended in the vertical direction and the partial wiring L41, L43, L45 are extended in the lateral direction, and between the resistor elements $R_6$ and $R_7$ adjacent in oblique direction in different lines, the partial wiring L42, L42, L44 are extended in the lateral direction and the partial wiring L41, L43, L45 are extended in the vertical direction.

Each wiring L40 is formed of a combination of partial wiring of {L41, 2×L42, L43, L44, L45}. That is to say, all the wiring L40 have equal width and length, and therefore equal area, so that they have equal parasitic capacitance component. Also, the through holes in the respective wiring L40 have equal resistance component, so that the sum total of the resistance components is equal in all the wiring L40.

Accordingly, in the interpolation circuit of the fourth preferred embodiment, the division is uniform between the output voltages $VI_y$ and $VIB_y$ (y=2, 3, 4, 6, 7, 8, 10, 11, 12) and $VI_z$ and $VIB_z$ (z=14, 15, 16), and then the accuracy of the output voltages is not deteriorated.

Furthermore, all the output terminals P and output terminals PB are regularly provided at the connecting terminals N41 and N42 of the resistor elements R, so that the output terminals P (PB) and P (PB) connected through one resistor element R can substantially be regarded as connected through one resistor element R and one wiring L40. Therefore the uniformity is not lost by the position of the output terminals P and the output terminals PB.

The wiring from the output terminals P, PB to the circuit blocks $C_n$ (n=1 to 4) in the folding circuit practically do not deteriorate the uniformity for the reason described in the first preferred embodiment.

When the resistance component of each wiring L40 is $r_4$, and the sum of the parasitic capacitance of resistor element R and the parasitic capacitance of wiring L40 is $C_4$, then the sum total of the resistance components connected between the input terminals $N_i$ and $N_{i+1}$ (i=1, 2, 3) of the interpolation circuit, between the input terminals $NB_i$ and $NB_{i+1}$ (i=1, 2, 3), between $N_4$ and $NB_1$, and between $NB_4$ and $N_1$, is always $4\times(R+r_4)$, and the sum total of the capacitance components is always $4C_4$.

As a result, the output signals of the interpolation circuit change in almost equal time length, thus considerably reducing the error caused in the outputs of the comparators.

Thus the A/D converter of the fourth preferred embodiment using the interpolation circuit of this layout can considerably improve the A/D conversion accuracy.

Although the fourth preferred embodiment has shown an interpolation circuit for increasing the amount of information fourfold, an interpolation circuit for increasing the amount of information twofold can be realized by connecting two sets of resistor elements R and wiring L40 in series between the input terminals. Also, an interpolation circuit for increasing the amount of information eight fold can be realized by connecting eight sets of resistor elements R and wiring L.

While the invention has been described in detail, the foregoing description is in all aspects illustrative and not restrictive. It is understood that numerous other modifications and variations can be devised without departing from the scope of the invention.

What is claimed is:

1. An A/D converter which analog-to-digital converts an analog input voltage to output a digital output voltage, comprising:

a reference conversion voltage output portion for converting said analog input voltage on the basis of a plurality of reference voltages to output a plurality of reference conversion voltages;

an intermediate voltage generating portion having a predetermined number of resistance units respectively provided between one voltage and the other voltage in pairs of said predetermined number of said reference conversion voltages in said plurality of reference conversion voltages, for generating a plurality of intermediate voltages by resistance division using said predetermined number of resistance units and outputting a plurality of conversion voltages including said plurality of intermediate voltages; and a digital data output portion for outputting the digital output voltage on the basis of said plurality of conversion voltages, wherein each of said predetermined number of resistance units in said intermediate voltage generating portion comprises, a first input terminal connected to said one voltage, a second input terminal connected to said other voltage, a plurality of resistor elements having the same resistance value, said plurality of intermediate voltages including at least part of voltages obtained from one end of each of said plurality of resistor elements, and a resistor connecting wiring provided so as to connect said plurality of resistor elements in series between said first and second input terminals, and wherein in all of said predetermined number of resistance units, said resistor connecting wiring is arranged so that the range between said one voltage and said other voltage is uniformly divided by said plurality of resistor elements in consideration of resistance component accompanying said resistor connecting wiring.

2. The A/D converter according to claim 1, wherein said reference conversion voltage output portion has its entire configuration integrally formed in respect of layout.

3. The A/D converter according to claim 1, wherein said plurality of reference conversion voltages include a first number of first reference conversion voltages and a second number of second reference conversion voltages, said reference conversion voltage output portion including a first partial reference conversion voltage output portion for outputting said first number of first reference conversion voltages and a second partial reference conversion voltage output portion for outputting said second number of second reference conversion voltages, said first and second partial reference conversion voltage output portions being formed separately from each other in respect of layout, wherein said intermediate voltage generating portion is provided between said first partial reference conversion voltage output portion and said second partial reference conversion voltage output portion in respect of layout.

4. The A/D converter according to claim 1, wherein said resistor connecting wiring includes a plurality of wiring corresponding to said plurality of resistor elements, said plurality of wiring each including first to Nth (N≧2) partial wiring composed of the same material, said ith (i=1 to N) partial wiring having equal width and equal length in all of said plurality of wiring, and wherein at least one of said first to Nth partial wiring is connected in a direction determined in accordance with connecting direction of a corresponding one of said plurality of wiring.

5. The A/D converter according to claim 1, wherein said plurality of reference conversion voltages include partial reference conversion voltages and inverse partial reference conversion voltages which are in complementary relation with each other, said partial reference conversion voltages in said plurality of reference conversion voltages include first to Mth (M≧2) partial reference conversion voltages whose phases are uniformly shifted in the order of first to Mth in one period, and said inverse partial reference conversion voltages in said plurality of reference conversion voltages include first to Mth inverse partial reference conversion voltages, said predetermined number of pairs of said reference conversion voltages including, pairs of the ith (i=1 to (M−1)) and (i+1)th partial reference conversion voltages, pairs of the ith and (i+1)th inverse partial reference conversion voltages, a pair of the first partial reference conversion voltage and the Mth inverse partial reference conversion voltage, and a pair of the first inverse partial reference conversion voltage and the Mth partial reference conversion voltage, wherein said predetermined number includes 2×M.

6. The A/D converter according to claim 1, wherein said plurality of conversion voltages further comprise said plurality of reference conversion voltages, and said resistor connecting wiring are arranged so that capacitance components of said plurality of resistor elements and said resistor connecting wiring have equal capacitance value in all of said predetermined number of resistance units.

7. The A/D converter according to claim 6, wherein said reference conversion voltage output portion has its entire configuration integrally formed in respect of layout.

8. The A/D converter according to claim 6, wherein said plurality of reference conversion voltages include a first number of first reference conversion voltages and a second number of second reference conversion voltages, said reference conversion voltage output portion including a first partial reference conversion voltage output portion for outputting said first number of first reference conversion voltages and a second partial reference conversion voltage output portion for outputting said second number of second reference conversion voltages, said first and second partial reference conversion voltage output portions being formed separately from each other in respect of layout, wherein said intermediate voltage generating portion is provided between said first partial reference conversion voltage output portion and said second partial reference conversion voltage output portion in respect of layout.

* * * * *

UNITED STATES PATENT AND TRADEMARK OFFICE
CERTIFICATE OF CORRECTION

PATENT NO.    : 6,278,395 B1                                               Page 1 of 1
DATED         : August 21, 2001
INVENTOR(S)   : Ito et al.

It is certified that error appears in the above-identified patent and that said Letters Patent is hereby corrected as shown below:

<u>Title page, Item [54] and Column 1, line 1,</u>
The title should read:

-- [54]  FOLDING AND INTERPOLATION ANALOG TO DIGITAL CONVERTER CIRCUIT --

Signed and Sealed this

Twenty-fourth Day of December, 2002

JAMES E. ROGAN
*Director of the United States Patent and Trademark Office*